(12) United States Patent
Mosterman et al.

(10) Patent No.: US 9,582,933 B1
(45) Date of Patent: Feb. 28, 2017

(54) INTERACTING WITH A MODEL VIA A THREE-DIMENSIONAL (3D) SPATIAL ENVIRONMENT

(71) Applicant: The MathWorks, Inc., Natick, MA (US)

(72) Inventors: Pieter J. Mosterman, Framingham, MA (US); Ebrahim Mestchian, Newton, MA (US); Jay R. Torgerson, Hopkinton, MA (US); Daniel F. Higgins, Hopkinton, MA (US); Paul F. Kinnucan, Milton, MA (US)

(73) Assignee: The MathWorks, Inc., Natick, MA (US)

( * ) Notice: Subject to any disclaimer, the term of this patent is extended or adjusted under 35 U.S.C. 154(b) by 442 days.

(21) Appl. No.: 13/730,279

(22) Filed: Dec. 28, 2012

Related U.S. Application Data

(63) Continuation-in-part of application No. 13/533,841, filed on Jun. 26, 2012, now Pat. No. 9,117,039.

(51) Int. Cl.
*G06F 17/50* (2006.01)
*G06T 17/10* (2006.01)

(52) U.S. Cl.
CPC .................................... *G06T 17/10* (2013.01)

(58) Field of Classification Search
CPC .. G06F 17/50; G06F 17/5004; G06F 2217/02; G06F 17/5095; G06F 2217/12; G06F 3/04812; G06F 3/04815; G06F 3/04842; G01N 2291/2694; G06T 7/001; G06T 19/00; G06T 19/20; G06T 2219/2004; G06T 19/006; G06T 2200/24
See application file for complete search history.

(56) References Cited

U.S. PATENT DOCUMENTS

| | | | |
|---|---|---|---|
| 6,028,593 A | 2/2000 | Rosenberg et al. | |
| 7,464,373 B1 * | 12/2008 | Yunt | G06F 8/10 |
| | | | 717/125 |
| 7,523,023 B1 | 4/2009 | Koh et al. | |
| 7,925,611 B1 | 4/2011 | Bromley et al. | |
| 8,954,187 B1 | 2/2015 | Mylet | |
| 8,954,195 B2 | 2/2015 | Summer et al. | |
| 9,117,039 B1 * | 8/2015 | Mosterman | G06F 17/5009 |

(Continued)

OTHER PUBLICATIONS

Nishino, Hiroaki, Utsumiya, K., & Korida, K. "A virtual environment for modeling 3D objects through spatial interaction." Systems, Man, and Cybernetics, 1999. IEEE SMC'99 Conference Proceedings. 1999 IEEE International Conference on. vol. 6. IEEE, 1999.*

(Continued)

*Primary Examiner* — Sultana M Zalalee
(74) *Attorney, Agent, or Firm* — Harrity & Harrity, LLP

(57) ABSTRACT

A device may provide, for display by a technical computing environment (TCE), a group of model elements of a model. The model, when executed, may simulate behavior of a system. The group of model elements may correspond to a group of physical elements of the system. The device may further detect interaction with a three-dimensional (3D) structure located within a spatial environment. The 3D structure may correspond to one or more physical elements of the group of physical elements of the system. The device may further cause the TCE to modify the model based on the detected interaction.

25 Claims, 13 Drawing Sheets

(56) References Cited

U.S. PATENT DOCUMENTS

| | | | |
|---|---|---|---|
| 9,245,068 B1* | 1/2016 | Mosterman | G06F 17/5018 |
| 2001/0037190 A1 | 11/2001 | Jung | |
| 2002/0010655 A1 | 1/2002 | Kjallstrom | |
| 2002/0080139 A1* | 6/2002 | Koo et al. | 345/473 |
| 2003/0093768 A1 | 5/2003 | Suzuki | |
| 2004/0083451 A1 | 4/2004 | Abowd et al. | |
| 2005/0044372 A1 | 2/2005 | Aull et al. | |
| 2005/0105793 A1 | 5/2005 | Sorek et al. | |
| 2005/0256694 A1* | 11/2005 | Taylor | G06F 17/5009 703/22 |
| 2005/0257195 A1 | 11/2005 | Morrow et al. | |
| 2005/0278162 A1* | 12/2005 | Ciolfi | G06F 17/5009 703/22 |
| 2006/0008151 A1 | 1/2006 | Lin et al. | |
| 2006/0038816 A1 | 2/2006 | Guest et al. | |
| 2006/0068910 A1 | 3/2006 | Schmidt et al. | |
| 2006/0150149 A1 | 7/2006 | Chandhoke et al. | |
| 2006/0167667 A1 | 7/2006 | Maturana et al. | |
| 2006/0199167 A1 | 9/2006 | Yang et al. | |
| 2008/0007568 A1 | 1/2008 | Chou et al. | |
| 2008/0013793 A1* | 1/2008 | Hillis et al. | 382/114 |
| 2008/0037571 A1 | 2/2008 | Hetzel et al. | |
| 2008/0040703 A1* | 2/2008 | Englehart | G06F 8/10 717/104 |
| 2008/0062167 A1 | 3/2008 | Boggs et al. | |
| 2008/0098349 A1* | 4/2008 | Lin | G06F 8/10 717/106 |
| 2008/0189638 A1 | 8/2008 | Mody et al. | |
| 2009/0036750 A1 | 2/2009 | Weinstein et al. | |
| 2009/0058799 A1* | 3/2009 | Huang et al. | 345/156 |
| 2009/0061404 A1 | 3/2009 | Toly | |
| 2009/0073034 A1 | 3/2009 | Lin | |
| 2009/0089031 A1 | 4/2009 | Sturrock et al. | |
| 2009/0157478 A1* | 6/2009 | Yang | G06Q 30/0201 705/7.29 |
| 2009/0292514 A1* | 11/2009 | McKim | G09B 9/00 703/6 |
| 2009/0315841 A1 | 12/2009 | Cheng et al. | |
| 2010/0009308 A1 | 1/2010 | Wen et al. | |
| 2011/0032255 A1 | 2/2011 | Favier et al. | |
| 2011/0040392 A1 | 2/2011 | Hamann et al. | |
| 2011/0060463 A1 | 3/2011 | Selker et al. | |
| 2011/0106339 A1 | 5/2011 | Phillips et al. | |
| 2011/0154243 A1 | 6/2011 | Styga et al. | |
| 2011/0205341 A1 | 8/2011 | Wilson et al. | |
| 2011/0261083 A1 | 10/2011 | Wilson | |
| 2012/0007891 A1 | 1/2012 | Chiang | |
| 2012/0095575 A1 | 4/2012 | Meinherz et al. | |
| 2012/0239169 A1* | 9/2012 | Smith | G05B 17/02 700/83 |
| 2012/0254830 A1 | 10/2012 | Conrad et al. | |
| 2012/0276993 A1 | 11/2012 | Lerner et al. | |
| 2012/0317501 A1 | 12/2012 | Milou | |
| 2012/0320080 A1* | 12/2012 | Giese et al. | 345/619 |
| 2013/0332119 A1 | 12/2013 | Santiquet et al. | |
| 2014/0108559 A1 | 4/2014 | Grochowicz et al. | |
| 2014/0122028 A1 | 5/2014 | Aberg | |
| 2014/0132594 A1 | 5/2014 | Gharpure et al. | |
| 2014/0157129 A1 | 6/2014 | Dinshaw et al. | |
| 2014/0163930 A1 | 6/2014 | Balon et al. | |
| 2014/0180644 A1 | 6/2014 | Maturana et al. | |
| 2014/0208272 A1 | 7/2014 | Vats et al. | |
| 2014/0241347 A1 | 8/2014 | Yadav et al. | |
| 2014/0247260 A1 | 9/2014 | Ghoneima et al. | |
| 2014/0317594 A1 | 10/2014 | He et al. | |
| 2014/0327670 A1 | 11/2014 | Chen et al. | |
| 2014/0365199 A1 | 12/2014 | Mosterman et al. | |

OTHER PUBLICATIONS

Izadi, Shahram, et al. "KinectFusion: real-time 3D reconstruction and interaction using a moving depth camera." Proceedings of the 24th annual ACM symposium on User interface software and technology. ACM, 2011.*

Piekarski, Wayne, et al. "Integrated head and hand tracking for indoor and outdoor augmented reality." Virtual Reality, 2004. Proceedings. IEEE. IEEE, 2004.*

Lee, Yong-Gu, et al. "Immersive modeling system (IMMS) for personal electronic products using a multi-modal interface." Computer-Aided Design 42.5 (2010): 387-401.*

Ohshima, Toshikazu, et al. "A mixed reality system with visual and tangible interaction capability-application to evaluating automobile interior design." Proceedings of the 2nd IEEE/ACM International Symposium on Mixed and Augmented Reality. IEEE Computer Society, 2003.*

McKinney, Kathleen, et al. "Interactive 4D-CAD." Proceedings of the third Congress on Computing in Civil Engineering. ASCE, Anaheim, CA, Jun. 1996.*

Kordon, Mark, et al. "Model-based engineering design pilots at jpl." IEEEAC paper 1678 (2007).*

Laviola et al., "3D Spatial Interaction: Applications for Art, Design, and Science", SIGGRAPH 2011 Course, 2011, 72 pages.

Tom Simonite, "Microsoft Has an Operating System for Your House", http://www.technologyreview.com/news/517221/microsoft-has-an-operating-system-for-your-house/?utm_campaign=newsletters&utm_source=newsletter-weekly-computing&utm_medium=email&utm_content=20130718, Jul. 18, 2013, 8 pages.

Microsoft, "Microsoft Research: The Lab of Things", http://www.lab-of-things.com/, Jun. 16, 2013, 1 page.

Microsoft, "Faculty Summit 2013", http://research.microsoft.com/en-us/events/fs2013/, Jul. 16, 2013, 2 pages.

Microsoft, "HomeOS: Enabling smarter homes for everyone", http://research.microsoft.com/en-us/projects/homeos/, Jun. 22, 2011, 3 pages.

Wikipedia, "Plug and play," http://en.wikipedia.org/wiki/Plug_and_play, Dec. 29, 2014, 6 pages.

Wikipedia, "3D printing" http://en.wikipedia.org/wiki/3D_printing, May 25, 2012, 9 pages.

Co-pending U.S. Appl. No. 13/533,841 entitled "Generating a Three- Dimensional (3D) Report, Associated With a Model, From a Technical Computing Environment (TCE)" filed Jun. 26, 2012, by Mosterman et al., 80 pages.

Co-pending U.S. Appl. No. 13/730,159 entitled "Altering an Attribute of a Model Based on an Observed Spatial Attribute" filed Dec. 28, 2012, by Mosterman et al., 51 pages.

Co-pending U.S. Appl. No. 13/730,092 entitled "Generic Human Machine Interface for a Graphical Model" filed Dec. 28, 2012, by Mosterman et al., 59 pages.

Co-pending U.S. Appl. No. 13/730,198 entitled "Linking of Model Elements to Spatial Elements" filed Dec. 28, 2012, by Ciolfi et al., 58 pages.

Co-pending U.S. Appl. No. 14/611,773 entitled "Automatic Generation of Models from Detected Hardware" filed Feb. 2, 2015, by Mosterman et al., 66 pages.

* cited by examiner

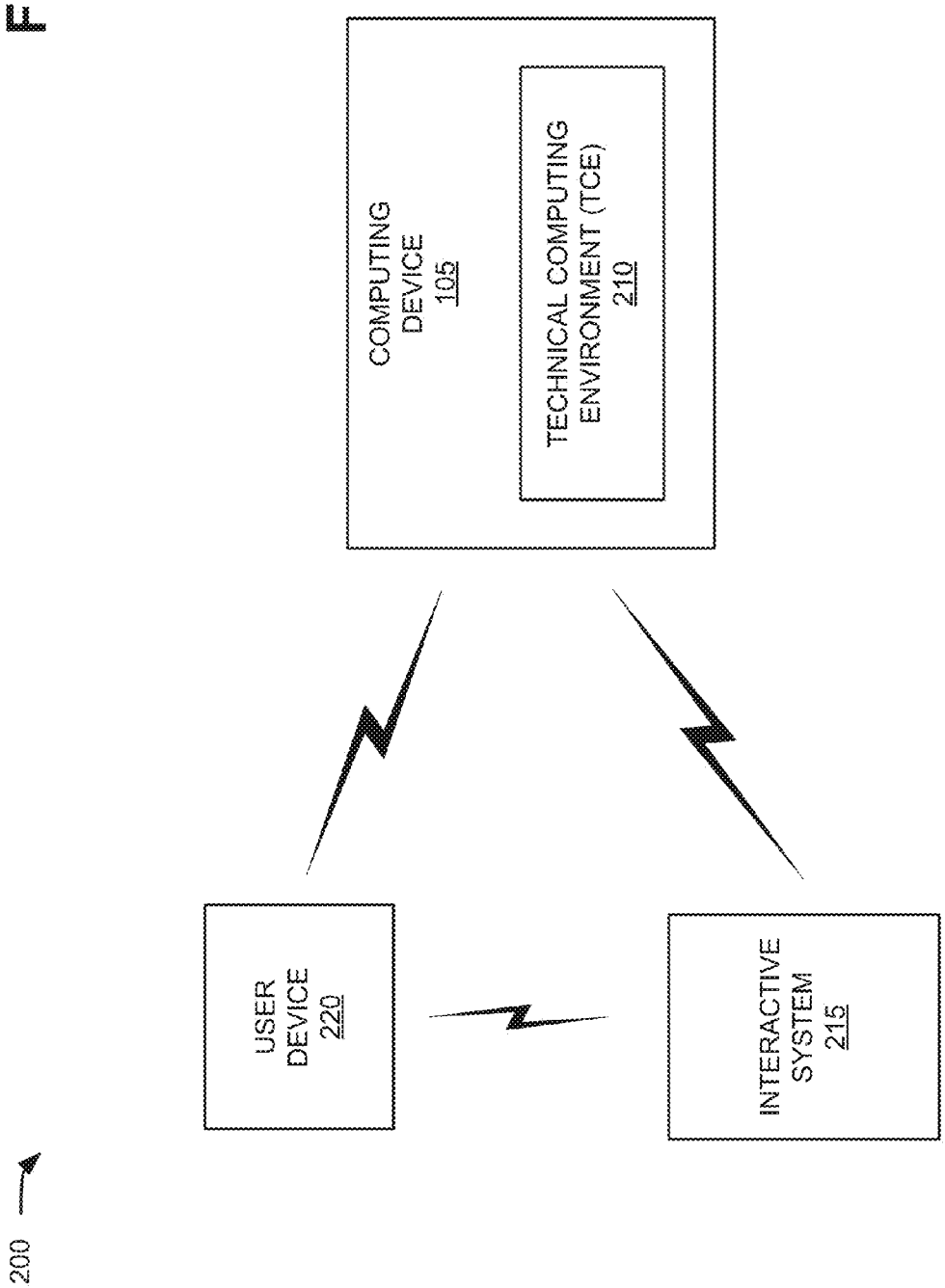

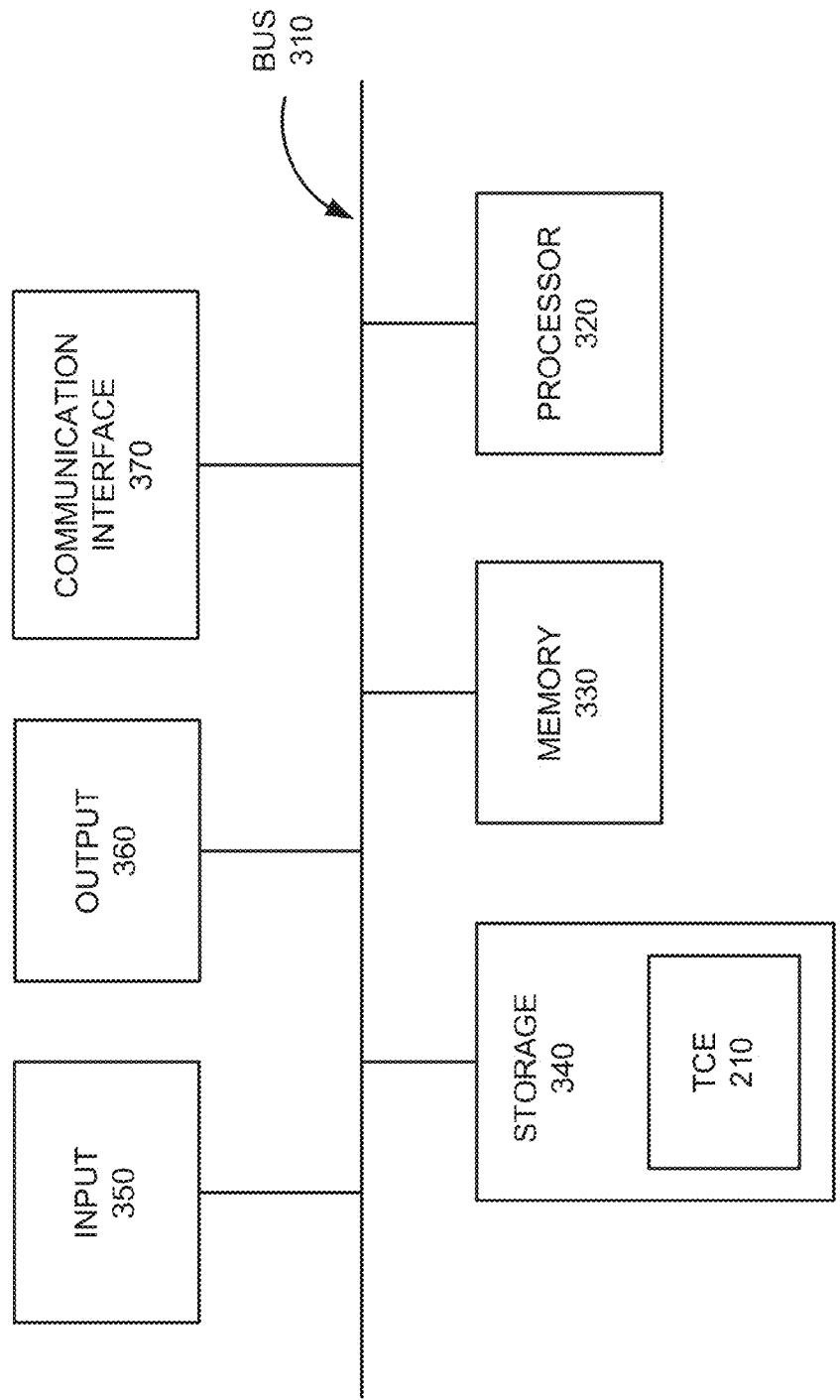

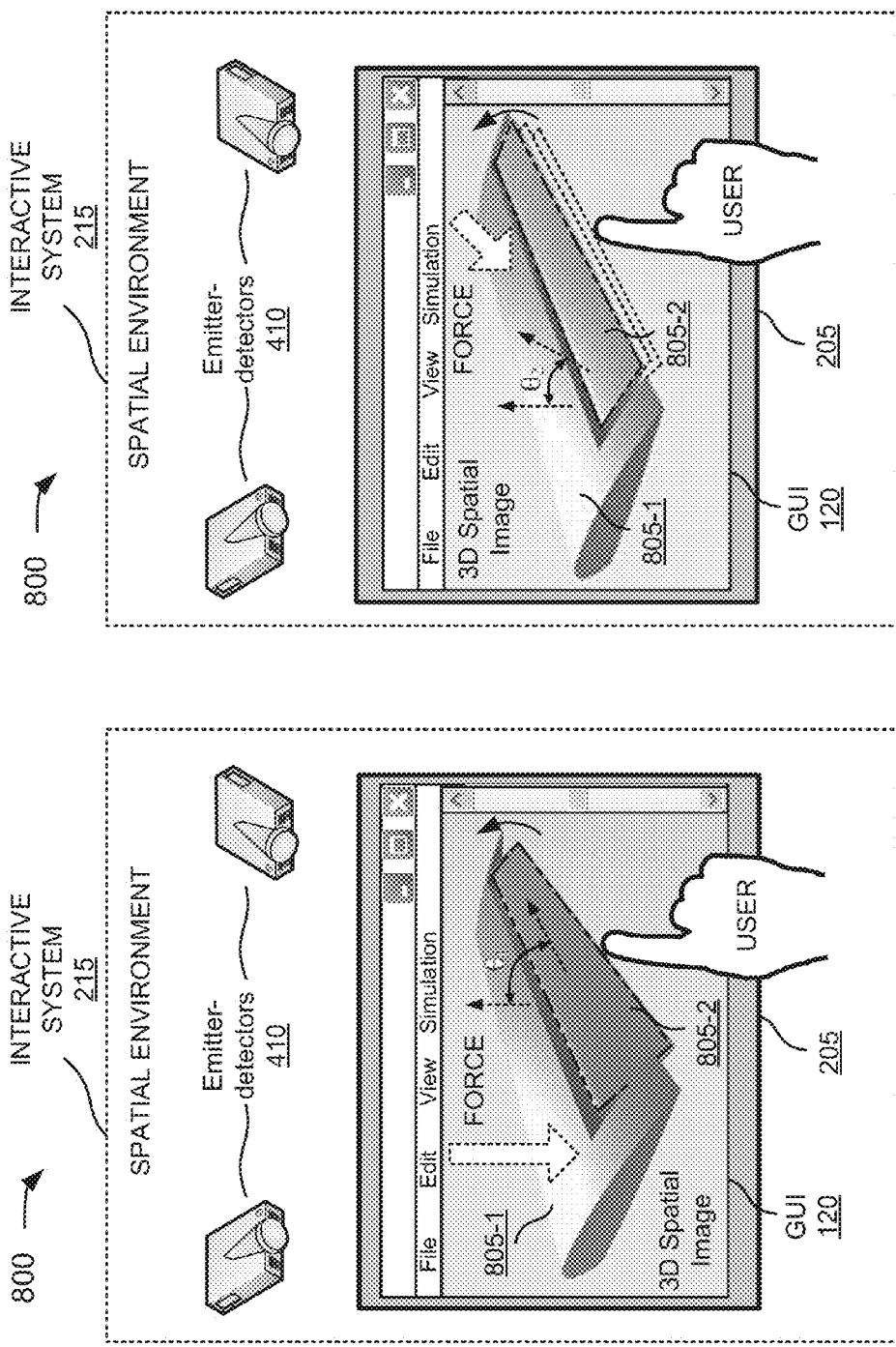

INTERACTING WITH A MODEL VIA A THREE-DIMENSIONAL (3D) SPATIAL ENVIRONMENT

REFERENCE TO RELATED APPLICATION

This continuation-in-part application claims priority to U.S. patent application Ser. No. 13/533,841, filed Jun. 26, 2012, the entire content of which is incorporated herein by reference.

BRIEF DESCRIPTION OF THE DRAWINGS

FIG. 2 is a diagram of an example environment in which systems and/or methods, described herein, may be implemented;

FIG. 3 is a diagram of example components of one or more devices of FIG. 2 according to one or more implementations described herein;

FIGS. 8A and 8B are diagrams of example user interactions with a 3D spatial representation being displayed within a spatial environment.

DETAILED DESCRIPTION OF PREFERRED EMBODIMENTS

Figure 1A:
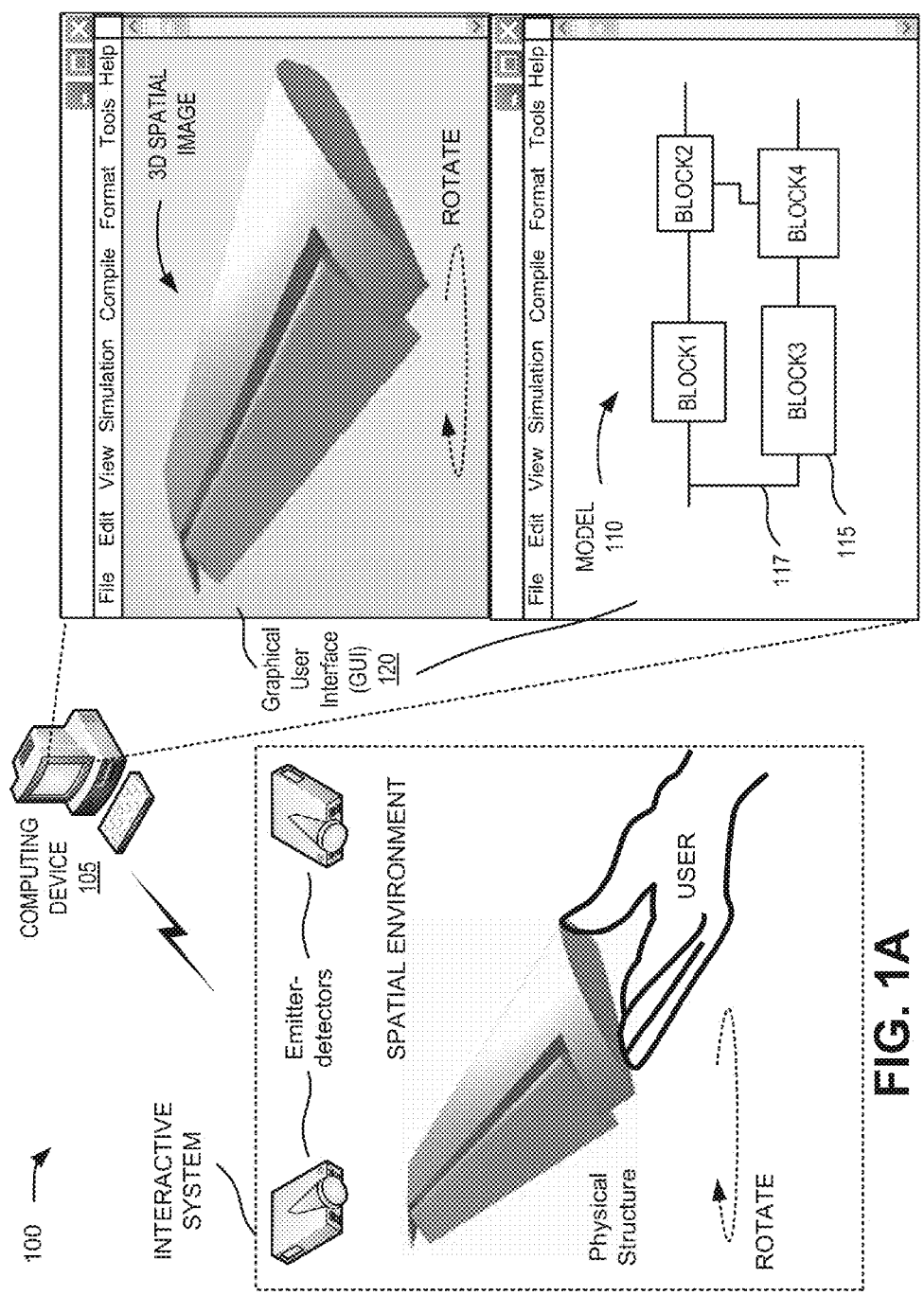
FIGS. 1A-1F are diagrams of example overviews of implementations described herein.

The following detailed description refers to the accompanying drawings. The same labels and/or reference numbers in different drawings may identify the same or similar elements.

A model may include a set of model elements that, when executed on a computing device, simulates behavior of a system, such as a dynamic system (e.g., an airplane wing/aileron system); a natural system (e.g., human organ, a plant, etc.), a physical system (e.g., a bouncing ball, etc.), etc. The system may include a set of physical elements that represent portions and/or components of the system. The model elements may correspond to physical elements and may, when executed, simulate the behavior of the physical elements and/or the system. The description below is described in the context of a dynamic system for simplicity. Systems and/or methods, described herein, may also be applied to static systems.

Systems and/or methods, described herein, may enable a computing device that uses a model to simulate a dynamic system, to communicate with an interactive system that provides a three-dimensional (3D) spatial environment with which a user, of the computing device, can interact. The user may interact with the model (e.g., to access, modify, navigate, and/or execute the model) by interacting with a 3D spatial representation, of the dynamic system, via the spatial environment. Interacting with the model via the spatial environment, instead of or in addition to using conventional techniques (e.g., based on a pointing device, a keyboard, etc.), may improve a user experience when using the model to run a simulation and/or improve a manner in which the model simulates behavior of the dynamic system.

The 3D spatial representation may correspond to a 3D physical structure or a 3D spatial image. The 3D physical structure may be based on a volume of material (e.g., plastic, metal, ceramic, etc.), that represents the dynamic system. The 3D spatial image may correspond to a stereoscopic and/or multi-scopic projection of the dynamic system (e.g., from two or more viewing angles) on a display device, and/or a holographic representation of the dynamic system in a 3D spatial volume and/or a 3D display media.

Systems and/or methods, as described herein, may use computing environments, such as a technical computing environment (TCE), for performing computing operations. A TCE may include any hardware and/or software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, Simscape™ software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models of systems and/or processes. The TCE may include additional tools, such as tools designed to convert a model into an alternate representation, such as source computer code, compiled computer code, or a hardware description (e.g., a description of a circuit layout). This alternate representation may also include a link to a tag that is associated with the model element. The tag, thus, may enable the TCE to navigate to the model element and/or to one or more hierarchical levels of a model in which the model element exists. Additionally, or alternatively, the tag may enable the TCE to navigate to an element, in the alternative representation, that includes the link to the tag. Additionally, or alternatively, the tag may enable the TCE to navigate to one or more hierarchical levels, of the alternate representation, in which the element exists. In an implementation, the TCE may provide this ability using graphical toolboxes (e.g., toolboxes for signal processing, image processing, color manipulation, data plotting, parallel processing, etc.). In another implementation, the TCE may provide these functions as block sets. In still another implementation, the TCE may provide these functions in another way.

Models generated with the TCE may be, for example, models of a physical system, a computing system, an engineered system, an embedded system, a biological system, a chemical system, etc. The models may be based on differential equations, partial differential equations, difference equations, differential and algebraic equations, difference equations, etc. In some implementations, models may be hierarchical, and include a number of hierarchical levels. A hierarchical level, of a hierarchical model, may be represented by an entity, such as a subsystem. The subsystem may be associated with a local namespace, where data may be globally accessible within the namespace, but not outside the namespace.

A model generated with the TCE may include, for example, any equations, assignments, constraints, computations, algorithms, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), noncausal block diagrams (e.g., via the Simscape™ product, available from The MathWorks, Incorporated), and/or any other type of model.

The values of attributes of a model generated with the TCE may be set to characteristics settings, such as one or more default settings, one or more inherited settings, etc. For example, the data type of a variable that is associated with a block may be set to a default, such as a double. Because of the default setting, an alternate data type (e.g., a single, an integer, a fixed point, etc.) may be inferred based on attributes of elements that the model includes (e.g., the data type of a variable associated with a connected block) and/or attributes of the graphical model. As another example, the causality of an equation (i.e., which variable in the equation is computed by using that equation) associated with a block may be inferred based on attributes of elements that the model includes (e.g., the fixed causality of source elements in the model, the preferred causality of integration over time, etc.).

As yet another example, the sample time associated with a block may be set to be inherited. In case of an inherited sample time, a specific sample time may be inferred based on attributes of elements that the graphical model comprises and/or attributes of the graphical model (e.g., a fundamental execution period). This inference may be performed by propagation of model element attributes. For example, after evaluating the sample time attribute of a first block, a graph search proceeds by evaluating the sample time attribute of a second block that is directly connected to the first block. The evaluating of the sample time attribute of the second block may account for the sample time attribute value of the first block (e.g., by adopting the value of the sample time attribute of the first block). Other attributes may also be inferred, such as dimension attributes and complexity attributes (e.g., whether a variable has an imaginary part).

As previously mentioned, an example embodiment of the TCE may use one or more text-based products, such as textual modeling environments. For example, a text-based modeling environment, may be implemented using products such as, but not limited to, MATLAB by The MathWorks, Inc.; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In an implementation, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on whole aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents®, Simscape™, etc., by The MathWorks, Inc.; VisSim by Visual Solutions; LabViewt by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

FIGS. 1A-1F are diagrams of example overviews of implementations described herein. As shown in FIG. 1A, example overview 100 may include a computing device 105 that is connected to an interactive system. The interactive system may provide a three-dimensional (3D) spatial environment that includes a volume of space that is covered by one or more emitter-detectors. The emitter-detectors may, for example, enable the interactive system to record video of all or a portion of a user (e.g., hands, arms, body, etc.) and/or object, such as a 3D physical structure, an inanimate object (e.g., a pen, pencil, book, etc.), a user device (e.g., a smart phone, etc.), etc. that are located within the spatial environment. The emitter-detectors may also, or alternatively, enable the interactive system to record audio and/or to communicate (e.g., wirelessly) with the user device within the spatial environment. The interactive system may provide spatial information to the computing device based on the video, audio, and/or communications obtained from the spatial environment.

Computing device 105 may receive spatial information from the interactive system. In one example, computing device 105 may receive first spatial information that describes the 3D physical structure (e.g., dimensions, surface contours, etc.) and/or that identifies a first location and/or orientation, of 3D physical structure, within the spatial environment. The 3D physical structure may, for example, correspond to a 3D spatial representation of a dynamic system (e.g., such a wing and/or aileron assembly, etc.).

Computing device 105 may obtain first information, associated with a 3D spatial representation that matches the first spatial information within a threshold amount. The first information may identify one or more first spatial elements that correspond to one or more physical elements of the dynamic system. Computing device 105 may obtain a model, such as model 110, based on the first information associated with the spatial representation. Model 110 may be executed by computing device 105 to simulate behavior of the dynamic system. Model 110 may include model elements (e.g., blocks 115 that are logically connected by connectors 117) that are associated with spatial elements of the 3D spatial representation. Each block 115 may include logic that, when executed, simulates behavior of a different physical element associated with the dynamic system.

Computing device 105 may provide a graphical user interface (GUI) 120 that includes a 3D spatial image of the dynamic system. In some implementations, the 3D spatial image, rendered in GUI 120, may actually include two separate images that, when viewed by the user, causes the spatial image to appear as a 3D spatial image. The 3D spatial image may be based on the first information associated with the 3D spatial representation. The 3D spatial image may include one or more first spatial elements. In addition to, or as an alternative to, providing the 3D spatial image, GUI 120 may provide a 2D video stream of the physical structure located within the spatial environment. In either event, computing device 105 may also, or alternatively, provide, for display and via the graphical user interface, one or more first blocks 115 (e.g., block1-block4) that correspond to the first spatial elements.

Figure 1B:
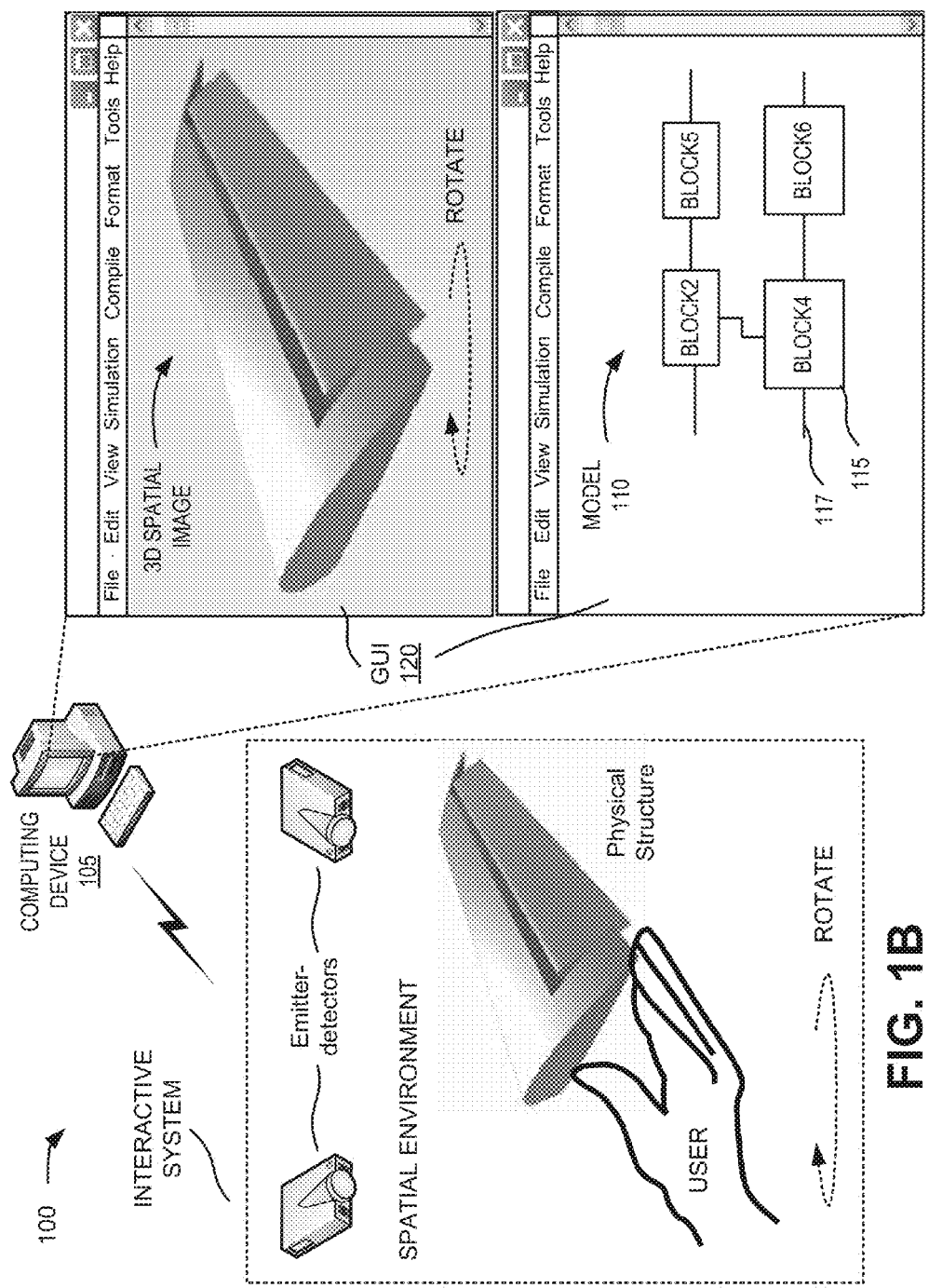

As shown in FIG. 1B, the user may cause the location and/or orientation, of the 3D physical structure, to change from a first location and/or orientation to a second location and/or orientation by moving the 3D physical structure (e.g., along any one of three dimensions of the spatial environment) and/or by rotating the 3D physical structure within the spatial environment (e.g., with respect to roll, pitch, and/or yaw). The interactive system may obtain second spatial information that identifies the change in location and/or orientation and may provide the second spatial information to computing device 105.

Computing device 105 may receive the second spatial information and may determine, from the second spatial information, that a viewing angle of the 3D spatial representation has changed based on the change from the first location and/or orientation, to the second location and/or orientation. Computing device 105 may, based on the change in location and/or orientation, cause the graphical user interface (e.g., GUI 120) to depict the 3D spatial image, of the dynamic system, in a manner that corresponds to a second viewing angle. The 3D spatial image, in this example, may include one or more second spatial elements that correspond to one or more physical elements, of the dynamic system, that are visible from the second viewing angle. Also, or alternatively, computing device 105 may cause GUI 120 to navigate to one or more second blocks 115 (e.g., block2, block4, block5, and block6) that correspond to the second spatial elements.

Figure 1C:
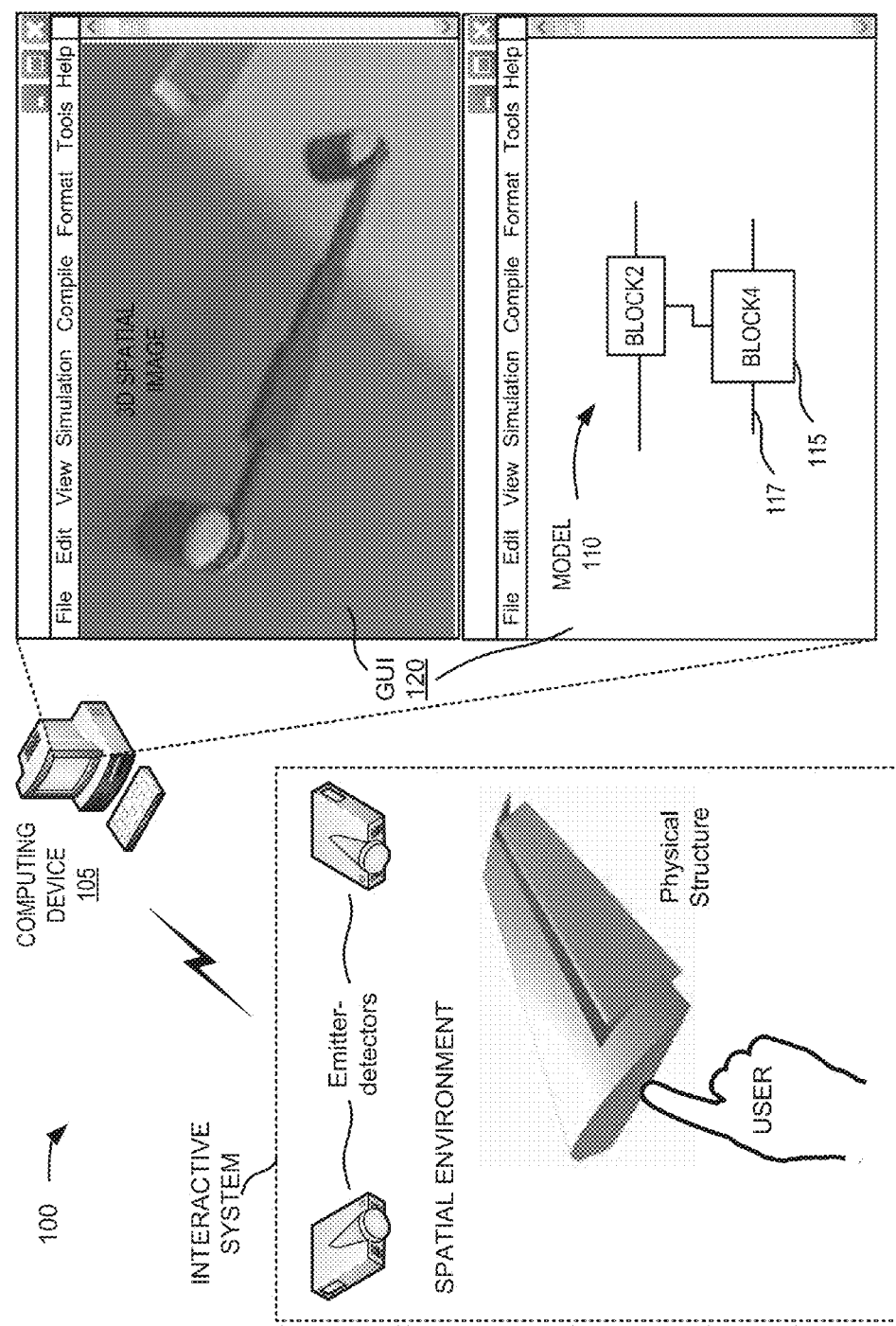

As shown in FIG. 1C, the user may interact with the spatial environment to select a particular component of the 3D physical structure (e.g., by pointing to the particular component, by tracing a border of the particular component, by speaking a code that identifies the particular component, etc.). The interactive system may obtain third spatial information, based on selection of the particular component, and may provide the third spatial information to computing device 105. Computing device 105 may receive the third spatial information and may determine, from the third spatial information, that the user has selected the particular component. Computing device 105 may identify information, associated with a particular spatial element, which corresponds to the particular component. Computing device 105 may cause GUI 120 to navigate (e.g., by zooming in, zooming out, etc.) to the particular spatial element. Computing device 105 may, in a manner similar to that described above, cause GUI 120 to navigate to one or more third blocks 115 (e.g., block2 and block4) that correspond to the particular spatial element.

Figure 1D:
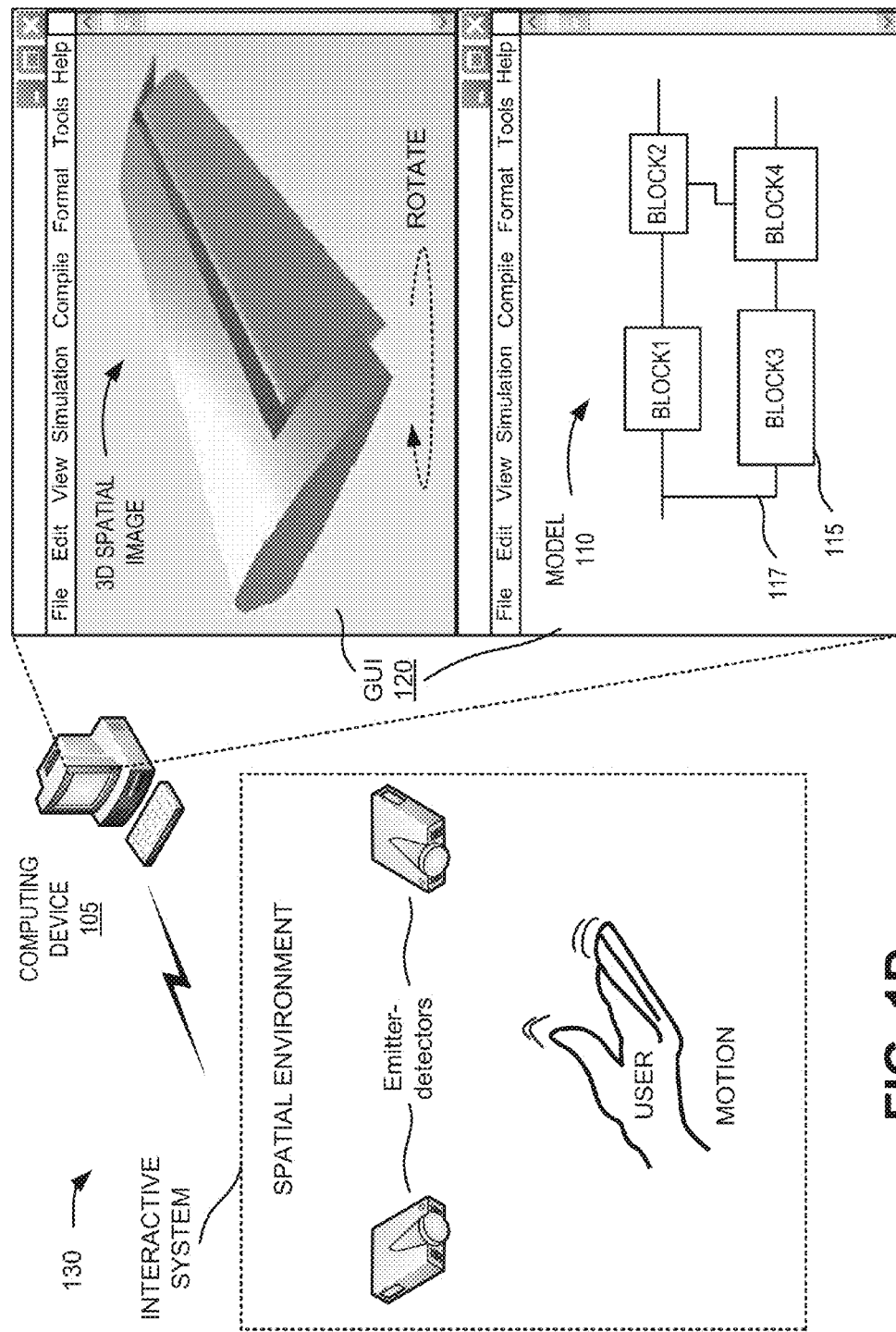

As shown in FIG. 1D, example overview 130 may include computing device 105, the interactive system, and GUI 120 as described above with respect to FIGS. 1A-1C. In this example, computing device 105 may provide, for display, a 3D spatial representation of a dynamic system. The 3D spatial representation may, in this example, be provided as a 3D spatial image (e.g., a stereoscopic image, etc.) of the dynamic system via GUI 120. Computing device 105 may also, or alternatively, identify one or more first spatial elements (e.g., that depict the wing, aileron, etc.), of the 3D spatial image associated with the first viewing angle. Computing device 105 may display, via GUI 120, one or more first blocks 115 (e.g., block1-block4) that correspond to the first spatial elements.

Figure 1E:
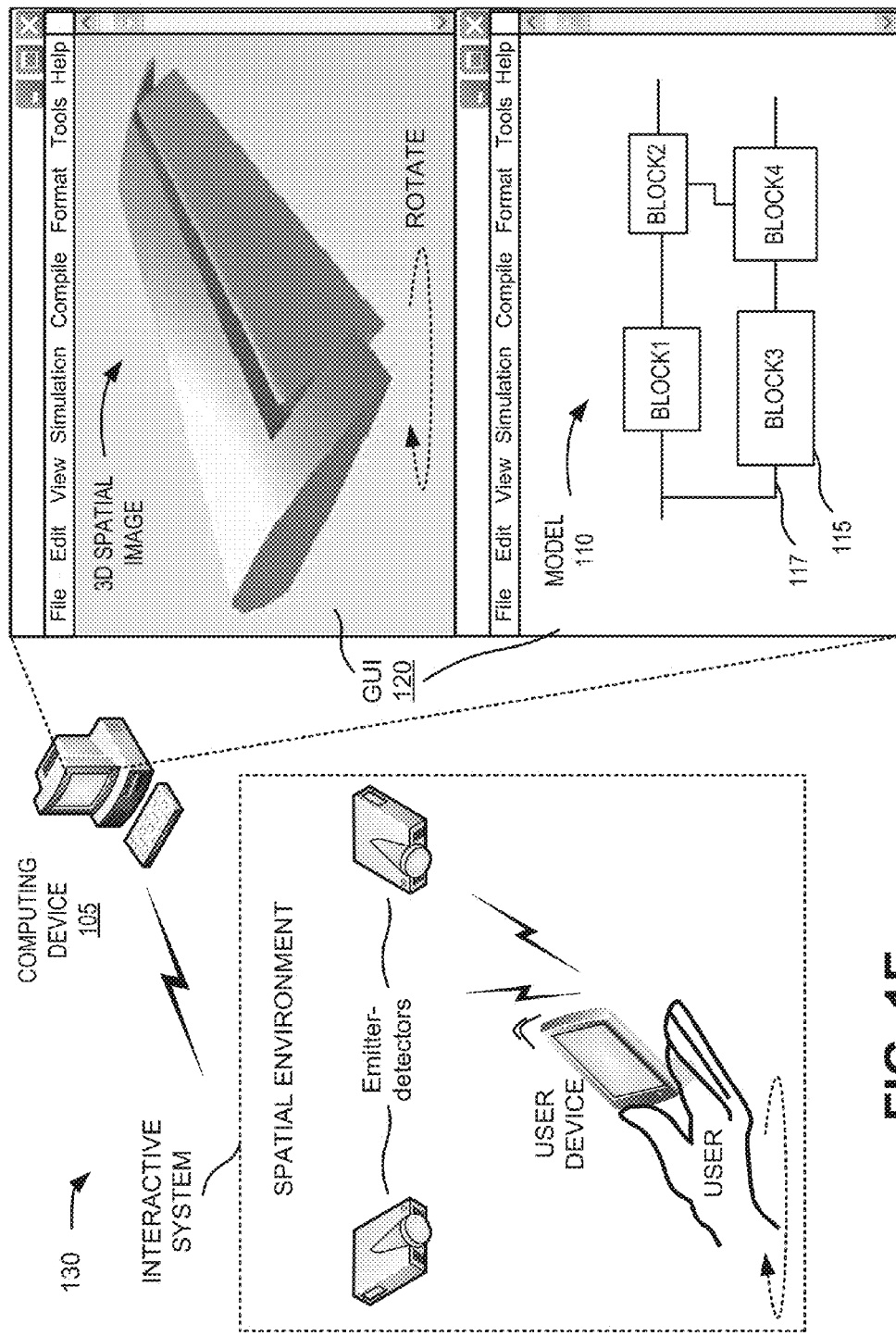

The user, of computing device 105, may interact with the spatial environment. For example, all or a portion of the user (e.g., fingers, hands, arms, head, eyes, etc.) may interact with the spatial environment using movements (e.g., hand movements up, down, right left, diagonal, etc.), hand rotations (e.g., associated with roll, pitch, yaw, etc.), hand gestures (e.g., making a fist, an okay sign, a thumbs up, thumbs down, pointing, etc.). The user may also, or alternatively, interact with the spatial environment using an inanimate physical object, such as a writing instrument (e.g., pen, pencil, etc.), a book, a note pad, etc. In one example, the user may hold the object and may move the object, rotate the object, etc. to interact with the physical environment. Additionally, or alternatively, as shown in FIG. 1E, the user may interact with the spatial environment using an object that corresponds to a user device (e.g., a smart phone, etc.). In this example, the user device may communicate with the interactive system and/or computing device 105 by providing information that identifies a location and/or an orientation, of the user device, within the spatial environment.

The interactive system may obtain fourth spatial information that identifies the user (e.g., the user's hand, the user's head, the user's eyes, etc.), and/or the object (e.g., the pencil, the book, the user device, etc.) within the spatial environment and may provide the fourth spatial information to computing device 105. The interactive system may also, or alternatively, obtain fifth spatial information that indicates that the user and/or the object has changed from a first location and/or orientation to a second location and/or orientation, within the spatial environment, based on gestures (e.g., hand gestures, such as pointing, making a fist, thumbs up, etc.) and/or movements made by the user and/or the object. The interactive system may provide the fifth spatial information to computing device 105.

Computing device 105 may receive the fourth spatial information and may associate the fourth spatial information with all or a portion of the 3D spatial representation. In this example, associating the fourth spatial information with one or more of the first spatial elements may enable all or the portion of the user and/or the object to be registered to correspond to all or a portion the 3D spatial image (e.g., to one, some, or all spatial elements associated with the 3D spatial image) based on the first viewing angle.

Computing device 105 may also, or alternatively, receive the fifth spatial information and may cause the 3D spatial image to be displayed, via GUI 120, based on a second viewing angle that corresponds to the change from the first location and/or orientation to the second location and/or orientation. The 3D spatial image, being displayed based on the second viewing angle, may include one or more second spatial elements. The second spatial elements may correspond to physical elements that are visible when the dynamic system is viewed from the second viewing angle. Computing device 105 may also, or alternatively, identify one or more second blocks 115 that correspond to the second spatial elements and may cause GUI 120 to navigate to the one or more second blocks 115 in a manner similar to that described above with respect to FIG. 1B.

Computing device 105 may also, or alternatively, display information (e.g., symbols, text, etc.), via GUI 120, that identifies other attributes associated with a spatial element, such as a simulated force, torque, stress, strain, etc. acting on a physical element with which the spatial element is associated. Computing device 105 may modify the information (e.g., change a location of a symbol, change an orientation of a symbol, change a size of a symbol, change a first symbol to a second, different symbol, change first text to second, different text, change a first font size or color to a second, different font size or color, etc.) to reflect a change in the attribute between the fourth spatial information and the fifth spatial information.

Figure 1F:
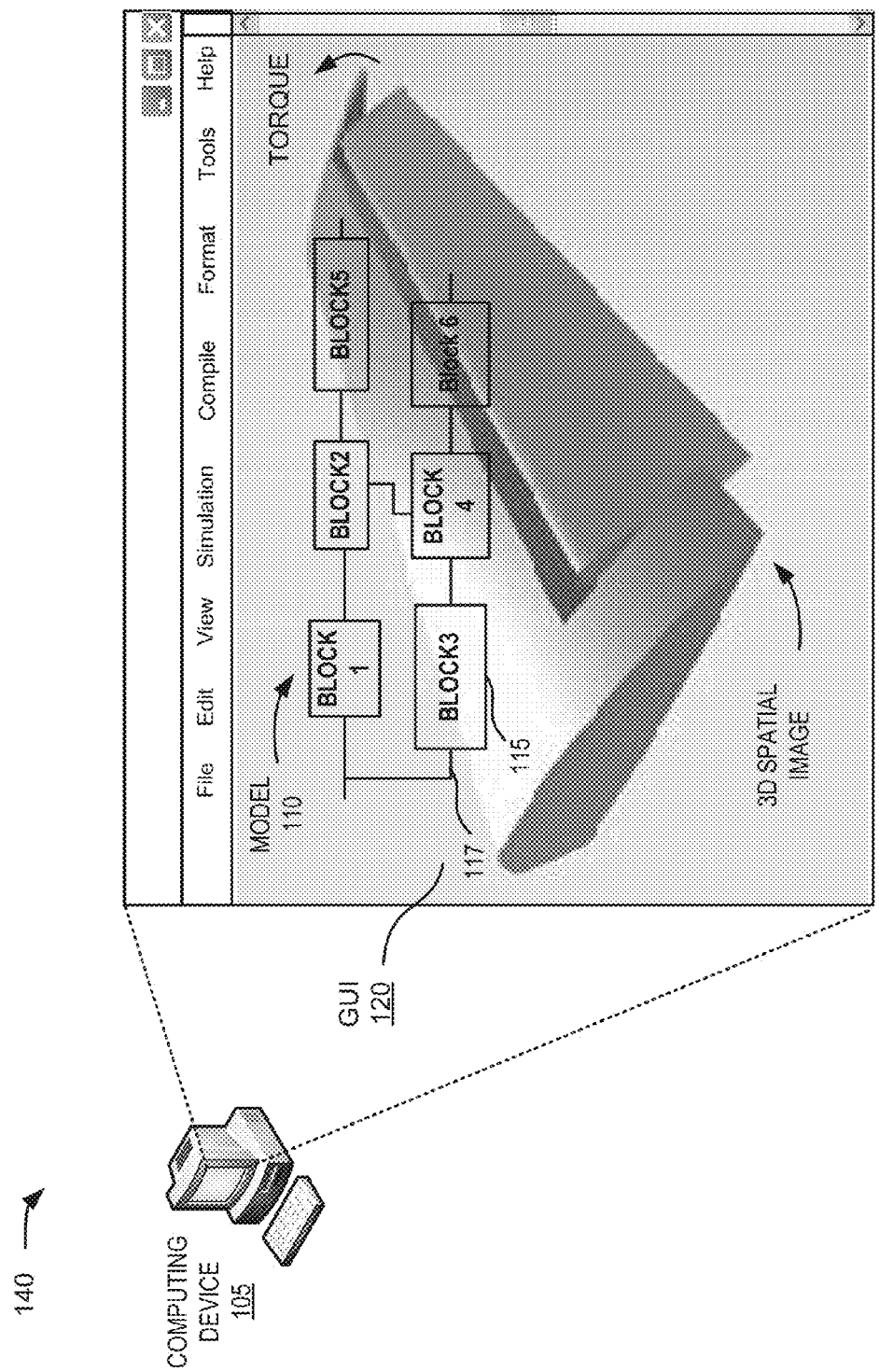

As shown in FIG. 1F, example overview 140 may include computing device 105 and GUI 120. For example, computing device 105 may display, via GUI 120, a 3D spatial image, blocks 115 (e.g., block1-block6) that correspond to model 110, and/or information identifying an attribute associated with a spatial element (e.g., shown as the curved arrow labeled "TORQUE"). In one example, computing device 105 may cause blocks 115 and/or the information identifying the attribute to be superimposed on the 3D spatial image within GUI 120. Computing device 105 may also, or alternatively, cause a two-dimensional (2D) physical copy of the superimposed 3D spatial image, blocks 115, and/or the attribute to be printed (e.g., by a printing device) on a print media (e.g., paper, transparency, etc.). Computing device 105 may also, or alternatively, display different combination of blocks 115 as an orientation, associated with the 3D spatial image, changes based on the user interacting via the spatial environment.

FIG. 2 is a diagram of an example environment 200 in which systems and/or methods, described herein, may be implemented. As illustrated, environment 200 may include computing device 105, an interactive system 215, and a user device 220. While FIG. 2 includes particular devices, in alternative implementations, environment 200 may include additional devices, fewer devices, different devices, or differently arranged devices than depicted in FIG. 2. Additionally, or alternatively, a device of environment 200 may perform an act described as being performed by another device of environment 200. Devices of environment 200 may be connected by wired connections, wireless connections, or a combination of wired and wireless connections.

Computing device 105 may include one or more devices that execute instructions to gather, process, search, store, and/or provide information in a manner similar to that described herein. For example, computing device 105 may include a server, a workstation, a mainframe, a computer (e.g., a desktop computer, a laptop computer, a tablet computer, etc.) and/or some other type of computational device. Computing device 105 may communicate with interactive system 215 to obtain spatial information that identifies a manner in which a user, of computing device 105, is interacting with a spatial environment. Computing device 105 may use the spatial information to identify and/or display a 3D spatial representation and may also, or alternatively, identify a model that corresponds to the 3D spatial representation. Computing device 105 and may provide a graphical user interface (e.g., GUI 120) that includes one or more model elements (e.g., blocks 115, connectors 117, etc.) associated with one or more spatial elements associated with the 3D spatial representation.

Computing device 105 may cause a viewing angle, scale, and/or some other attribute (e.g., force, stress, strain, torque, etc.) associated with one or more spatial elements to change based on instructions that are provided by the user via the spatial environment. In some implementations, the instructions may be included within the spatial information. Computing device 105 may execute the model to generate first results and may modify a parameter, associated with a model element, based on changes to attributes associated with a spatial element. Computing device 105 may execute the model using the modified parameter to generate second results that may be different than the first results.

Computing device 105 may host a TCE 210. TCE 210 may include hardware-based logic and/or a combination of hardware and software-based logic that provides a computing environment. TCE 210 may permit a user to perform tasks related to a discipline or a domain. For example, TCE 210 may pertain to mathematics, science, engineering, medicine, business, and/or another type of discipline or domain in a manner similar to that described above.

Interactive system 215, to be described in greater detail below with respect to FIG. 4, may include one or more components that provide a spatial environment and/or are capable of communicating with computing device 105 and/or user device 220. Interactive system 215 may, for example, include one or more cameras, video cameras, infrared cameras, sonar, radar, depth sensors, microphones, multi-array microphones, lasers, photo detectors, radio frequency (RF) transmitters and/or receivers, electromagnetic field detectors, etc. Interactive system 215 may provide the spatial environment by monitoring a 3D volume of space. Interactive system 215 may, based on monitoring the 3D volume of space, obtain information (e.g., images, video, audio, RF signatures, optical signatures, electromagnetic field signatures, etc.) associated with a user and/or object that is detected within the spatial environment.

Interactive system 215 may use the information associated with the user or object, to generate spatial information that identifies dimensions, surface contours, etc. of the user (e.g., the user's hand, head, eyes, etc.) and/or the object (e.g., a 3D physical structure, pen, pencil, book, user device 220, etc.). The spatial information may also, or alternatively, include geometric information, such as the length, the size, the shape, etc. of the user (e.g., the user's hand, head, eyes, etc.) and/or the object. The spatial information may also, or alternatively, identify a location and/or an orientation associated with the user and/or object (e.g., based on roll, pitch, yaw, location, velocity, acceleration, etc.) and/or particular gestures and/or movements that identify instructions provided by the user, etc. Interactive system 215 may provide the spatial information to computing device 105.

User device 220 may include one or more devices capable of communicating with interactive system 215 and/or computing device 105. For example, user device 220 may include a laptop computer, a tablet computer, a wireless mobile device, a smart phone, etc. User device 220 may include a component, such as gyroscope component, an accelerometer component, a global positioning system (GPS) component, etc., that provides information associated with a location and/or orientation of user device 220 that is located within a spatial environment. User device 220 may provide the information, associated with the location and/or orientation, to interactive system 215 and/or computing device 105. User device 220 may provide the information via a wireless connection (e.g., via a wireless local area network, a Bluetooth® connection, a service provider network, etc.), a wired connection (e.g., a USB cable, etc.), or a combination of wireless and/or wired connections.

FIG. 3 is a diagram of an example device 300 that may correspond to computing device 105 and/or user device 220. Alternatively, each of computing device 105 and/or user device 220 may include one or more devices 300. As shown in FIG. 3, device 300 may include bus 310, processor 320, memory 330, storage 340, input component 350, output component 360, and/or communication interface 370. In other implementations, device 300 may include fewer components, additional components, different components, and/or a different arrangement of components than those depicted in FIG. 3. Additionally, or alternatively, a component of device 300 may perform an act described as being performed by another component of device 300.

Bus 310 may permit communication among the other components of device 300. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphical processing unit (GPU), a co-processor, a network processor, an application specific integrated circuit (ASIC), an application specific instruction-set processor (ASIPs), a system-on-chip (SOC), a controller, a programmable logic device (PLD), a chipset, and/or a field programmable gate array (FPGA).

Memory 330 may store data and/or instructions related to the operation and use of device 300. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a magnetoresistive random access memory (MRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of device 300. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from device 300, such as a Universal Serial Bus (USB) memory stick, a hard disk, etc. In an implementation, as illustrated, storage 340 may store TCE 210.

Input component 350 may permit the user and/or another device to input information into device 300. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit device 300 to output information to the user and/or another device. For example, output component 360 may include a display, a projector, a speaker, a light emitting diode (LED), a haptic device, a tactile device, an output port, and/or some other type of output component.

Communication interface 370 may permit device 300 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, device 300 may perform certain operations relating to implementations described herein. Device 300 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Figure 4:
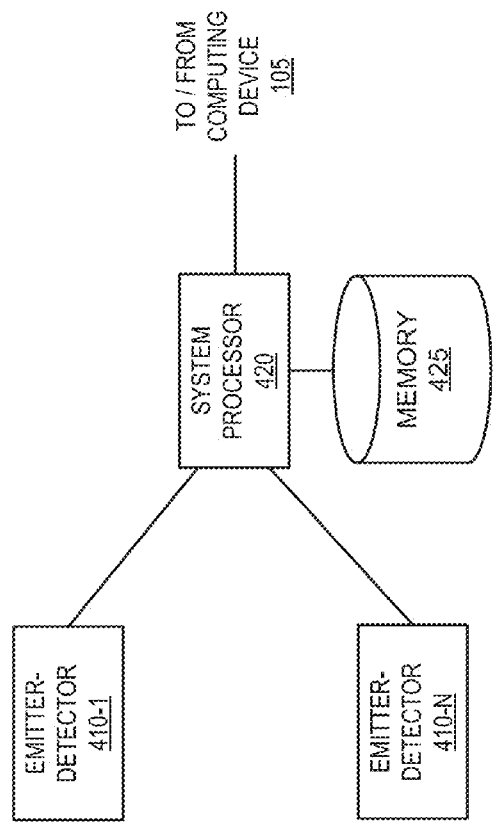
FIG. 4 is a diagram of example components of an interactive system of FIG. 2 according to one or more implementations described herein.

FIG. 4 is a diagram of example components of interactive system 215 of FIG. 2 according to one or more implementations described herein. Interactive system 215 may include a group of emitter-detectors 410-1, . . . , 410-N (where N≥1) (hereinafter referred to collectively as "emitter-detectors 410" and individually as "emitter-detector 410"), a system processor 420, and a memory 425. A quantity of components, associated with interactive system 215, is provided for explanatory purposes. Additionally, or alternatively, interactive system 215 may include fewer components, additional components, different components, and/or a different arrangement of components than those depicted in FIG. 4. Additionally, or alternatively, a component of interactive system 215 may perform an act described as being performed by another component of interactive system 215.

Emitter-detector 410 may obtain information associated with a user or object located within and/or interacting with a 3D volume of space that corresponds to a spatial environment. For example, emitter-detector 410 may include a camera, a RF transmitter, a RF receiver, a speaker, a microphone, a multi-array microphone, a laser, a sonar, a radar, an infrared camera, a depth sensor, a photodetector, a magnetic and/or electromagnetic component, etc. Emitter-detector 410 may, for example, use a camera to record images and/or video (e.g., based on frequencies that correspond to visible light, infrared, ultraviolet, etc.) of all or a portion of a user (e.g., the user's hands, fingers, head, eyes, body, etc.) and/or an object (e.g., 3D physical structure, pen, pencil, book, user device 220, etc.) interacting with the spatial environment. Emitter-detector 410 may provide the video to system processor 420 to be processed. Additionally, or alternatively, emitter-detector 410 may use a transmitter that transmits a signal (e.g., a RF transmitter to transmit a RF signal, a speaker to transmit an acoustic signal, etc.) into the spatial environment. Emitter-detector 410 may use a receiver (e.g., a RF receiver, a microphone, etc.) to receive a signal that reflects off the user and/or object located within the spatial environment (e.g., a RF receiver to receive a reflected RF signal, a microphone to receive a reflected acoustic signal, etc.). The received signal may identify dimensions, surface contours, location, orientation, etc. of the user and/or object within the spatial environment. Emitter-detector 410 may convert the received signal to an electrical signal and/or a format that can be processed by system processor 420. Emitter-detector 410 may also, or alternatively, receive a signal from an object, within the spatial environment, that corresponds to user device 220. In this example, the received signal may identify a location and/or an orientation, associated with user device 220, within the spatial environment.

Emitter-detector 410 may also, or alternatively, use a laser that transmits an optical signal that scans the spatial environment. Emitter-detector 410 may also, or alternatively, use a photodiode and/or some other component that receives a reflected optical signal from the user and/or object that is located within the spatial environment. The reflected signal may identify dimensions, surface contours, location, orientation, etc. associated with the user and/or object within the spatial environment. Emitter-detector 410 may convert the reflected optical signal to an electrical signal and/or to a format that can be received and/or processed by system processor 420.

Additionally, or alternatively, emitter-detector 410 may be implemented as two or more separate devices. In one example, emitter functions (e.g., that enable information and/or signals to be transmitted to the spatial environment) may be implemented in a separate device from detector functions (e.g., that receive transmitted and/or reflected information and/or signals from the spatial environment). For example, a first emitter-detector 410, that performs emitter functions, may transmit a signal (e.g., a RF signal, an acoustic signal, an optical signal, etc.) into the spatial environment and a second emitter-detector 410, that performs detector functions, may receive the transmitted signal and/or a reflected signal that reflects off of the user and/or object located within the spatial environment. The first emitter-detector 410 and the second emitter-detector 410 may be mono-static with respect to the spatial environment (e.g., associated with approximately the same viewing angle with respect to the spatial environment) or may be bi-static or multi-static with respect to the spatial environment (e.g., associated with different viewing angles with respect to the spatial environment).

System processor 420 may execute instructions to gather, process, search, store, and/or provide information in a manner similar to that described herein. For example, system processor 420 may receive, from emitter-detector 410, video content and/or signals that include information associated with a user and/or object located within the spatial environment. System processor 420 may also, or alternatively, process the received information to create spatial information associated with the user and/or object. In one example, system processor 420 may receive information from two or more emitter-detectors 410 that obtain information, associated with the spatial environment, from two or more viewing angles. System processor 420 may use the information, obtained from the two or more viewing angles, to perform stereoscopic and/or holographic processing on received information to generate spatial information, associated with the user and/or object, based on three-spatial dimensions. In one example, the spatial information may represent a signature (e.g., a visual signature, an infrared signature, a RF signature, an acoustic signature, etc.) of the user and/or object (e.g., in two dimensions, three-dimensions, etc.).

System processor 420 may, for example, process the received information to identify the user and/or object based on dimensions (e.g., length, width, height, etc.), surface contours (e.g., boundaries, edges, curvatures, etc.), etc. associated with the user and/or object. System processor 420 may also, or alternatively, process the information to identify a location and/or an orientation, associated with the user and/or object, based on a three-dimensional coordinate system associated with the spatial environment. The location may be based on a coordinate system, associated with the spatial environment, such as, a Cartesian coordinate system (e.g., based on orthogonal x-axis, y-axis, z-axis), a cylindrical coordinate system (e.g., based on radial distance (p), height distance (z), and angular component ($\phi$); a spherical coordinate system (e.g., based on radial distance (p), azimuth angle ($\phi$), and polar angle ($\theta$)), etc. The orientation may also, or alternatively, be represented by an amount of roll, pitch, and/or yaw of the user and/or object within the spatial environment. System processor 420 may also use the received information to identify particular gestures (e.g., hand gestures, etc.) and/or movements by the user and/or object that represent instructions (e.g., select a spatial element, select a model element, execute a model, change an orientation, change an attribute associated with a model, change a value of an attribute associated with a model, etc.) to be interpreted by computing device 105. System processor 420 may also use the received information to determine a change in location and/or orientation, of the user and/or object, as a function of time. System processor 420 may provide the processed information, as spatial information, to computing device 105.

Memory 425 may store data and/or instructions related to the operation and use of interactive system 215. For example, memory 425 may store data and/or instructions that may be configured to implement an implementation described herein. Memory 425 may include, for example, a RAM, a DRAM, a SRAM, a SDRAM, a MRAM, a FRAM, a ROM, a PROM, an EPROM, an electrically erasable programmable read only memory EEPROM and/or a flash memory. Memory 425 may also, or alternatively, store spatial information obtained and/or generated based on monitoring the spatial environment.

Figure 5:
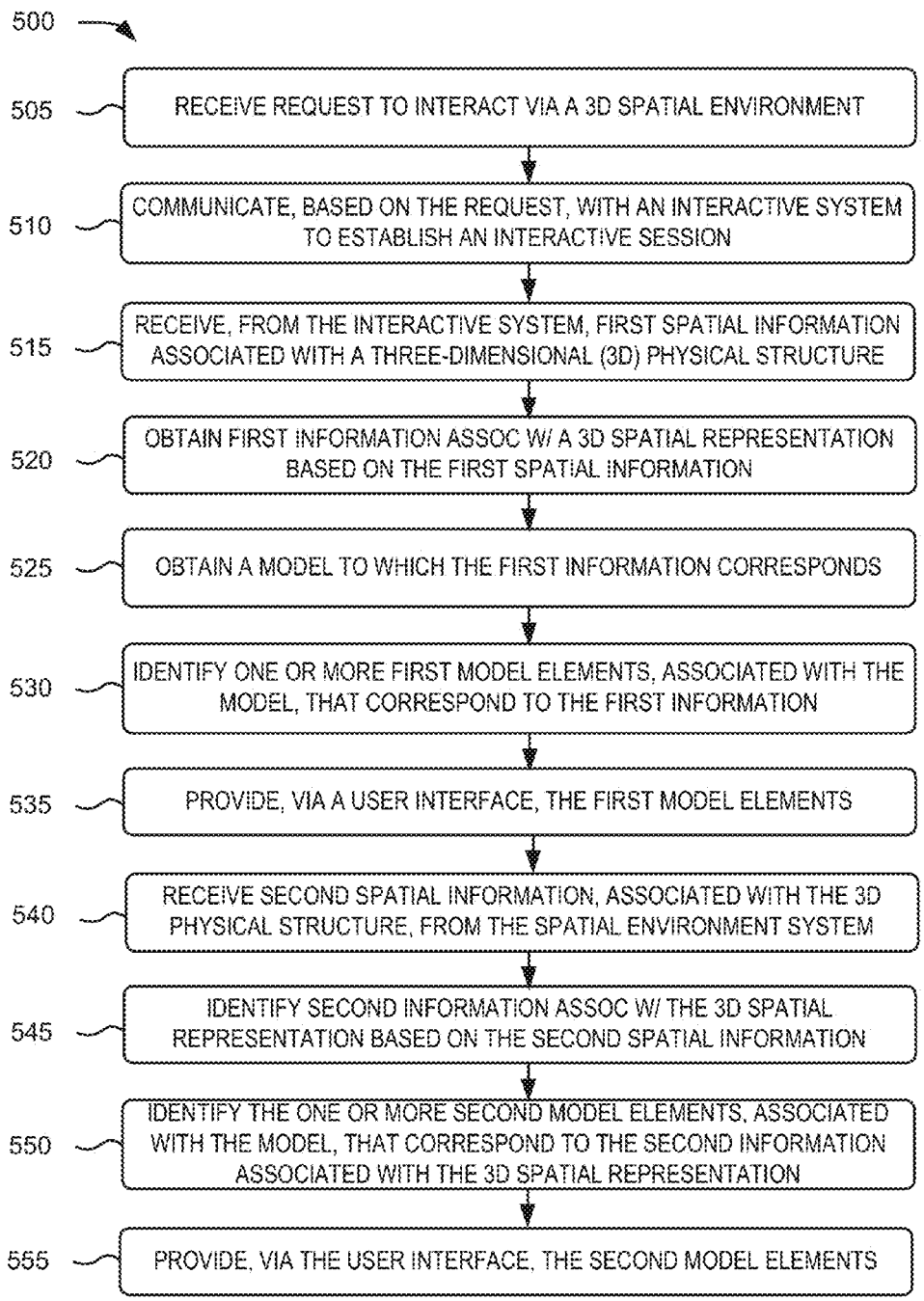
FIG. 5. is a flow chart of an example process for interacting with a spatial environment, using a 3D physical structure, to access, modify, navigate, or execute a model with which the 3D physical structure is associated.

FIG. 5. is a flow chart of an example process 500 for interacting with a spatial environment, using a 3D physical structure, to access, modify, navigate, or execute a model with which the 3D physical structure is associated. In one implementation, process 500 may be performed by computing device 105. Additionally, or alternatively, process 500 may be performed by a device, or group of devices, separate from, or in combination with, computing device 105.

As shown in FIG. 5, process 500 may include receiving a request to interact via a spatial environment (act 505) and communicating with an interactive system to establish an interactive session (act 510). For example, computing device 105 may receive a request to establish an interactive session with a user of computing device 105. In one example, the user may instruct computing device 105 (e.g., using a keyboard, a pointing device, etc.) to establish the interactive session with interactive system 215. Additionally, or alternatively, the user may interact with a spatial environment, provided by interactive system 215, which may cause interactive system 215 to provide the request to computing device 105. For example, the user (e.g., the user's body, hand, arm, head, etc.) and/or a 3D physical structure may enter the spatial environment. Interactive system 215 may detect the presence of the user, or a gesture made by the user (e.g., thumbs up, etc.), and/or the 3D physical structure within the spatial environment and may provide the request to establish the interactive session to computing device 105.

Computing device 105 may receive the request and may communicate with interactive session 215 to indicate that computing device 105 is available and/or that the interactive session is established. In one example, computing device 105 may obtain, from the request, information associated with the particular gesture and may determine, based on the particular gesture, that an interactive session is to be established. Computing device 105 may also, or alternatively, cause TCE 210 to display a graphical user interface via which information, associated with the session, can be displayed (e.g., model elements, spatial elements, model attributes, etc.).

As also shown in FIG. 5, process 500 may include receiving, from the interactive system, first spatial information associated with a 3D physical structure (act 515) and identify first information, associated with a 3D spatial representation, based on the first spatial information (act 520). For example, computing device 105 may receive, from interactive system 215, first spatial information associated with a 3D physical structure that is located within the spatial environment. In this example, interactive system 215 may obtain information, associated with the 3D physical structure, that is located within the spatial environment (e.g., being held by a user, placed on a surface, suspended from a fixture above the spatial environment, etc.). Interactive system 215 may also, or alternatively, obtain the information, associated with the 3D physical structure, from two or more viewing angles (e.g., stereoscopic viewing angles based on two or more locations of emitter-detectors 410 with respect to the spatial environment). Interactive system 215 may provide, to computing device 105, first spatial information based on the information, associated with the physical structure, obtained from the stereoscopic viewing angles. In some implementations, the 3D physical structure may be replaced with a 3D virtual representation of the 3D physical structure. Thus, computing device 105 may receive, from interactive system 215, first spatial information associated with the 3D virtual representation.

The first spatial information may include one or more characteristics of the 3D physical structure. For example, the first spatial information may, as described above with respect to FIG. 4, include information describing the 3D physical structure (e.g., dimensions, surface contours, etc.) from stereoscopic viewing angles within the spatial environment. The first spatial information may also, or alternatively, include information identifying a first location and/or orientation of the 3D physical structure within the spatial environment. The first orientation may, for example, correspond to a first location within the spatial environment (e.g., based on first 3D coordinates x1, y1, and z1 or some other first coordinates). The first orientation may also, or alternatively, correspond to a first amount of roll (e.g., a first angle of rotation, θR, about the x-axis within the spatial environment), a first amount of pitch (e.g., a first angle of rotation, θP, about the z-axis within the spatial environment), and/or a first amount of yaw (e.g., a first angle of rotation, θY, about the y-axis within the spatial environment) associated with the 3D physical structure.

Computing device 105 may identify information, associated with a 3D spatial representation, based on the first spatial information. For example, computing device 105 may compare the first spatial information to information, associated with one or more 3D spatial representations, stored within computing device 105. In this example, the first spatial information may represent a signature associated with the 3D physical structure (e.g., an optical signature, a RF signature, an acoustic signal, a laser scan, etc.) based on the first location and/or orientation. Computing device 105 may determine which of one or more signatures, stored within computing device 105, most closely matches the signature associated with the 3D physical structure. Computing device 105 may select a stored signature that most closely matches the signature associated with the 3D physical structure. Computing device 105 may identify a 3D spatial representation with which the stored signature is associated and may retrieve information associated with the 3D spatial representation.

Additionally, or alternatively, computing device 105 may obtain, from the first spatial information, information that describes the 3D physical structure (e.g., dimensions, surface contours, etc.) based on the first orientation and may determine which of the stored information, associated with a 3D spatial representation, matches the information that describes the 3D physical structure. In one example, computing device 105 may use a scaling value to process information, describing the 3D physical structure, e.g., to scale-up dimensions, surface contours, etc., associated with the 3D physical structure. Computing device 105 may, for example, scale-up (e.g., increase) the dimensions, associated with the 3D physical structure, to dimensions associated with a dynamic system (e.g., based on a scaling value of one inch of the 3D physical structure corresponds to one foot associated with the dynamic system, and/or some other scaling value). The scaling value may, for example, be predetermined by computing device 105, programmed by the user, etc. Computing device 105 may select stored information that most closely matches the information that describes the 3D physical structure and/or the processed information that describes the 3D physical structure. Computing device 105 may identify a 3D spatial representation with which the stored information is associated and may retrieve information associated with the 3D spatial representation.

The 3D spatial representation may correspond to a dynamic system (e.g., an airplane wing/aileron system, an automobile door/window system, a pick-and-place manufacturing system, etc.). The information, associated with the 3D spatial representation, may be based on a collection of one or more or more viewing angles associated with the 3D spatial representation (e.g., between zero and 360 degrees about the x-axis, y-axis, and/or z-axis). The information, associated with the spatial representation, may also, or alternatively, identify one or more spatial elements associated with the 3D spatial representation. The spatial elements may, for example, correspond to physical elements (e.g., the wing, aileron, components that connect the wing and aileron, etc.) associated with the dynamic system.

In one example, computing device 105 may provide, for display and via a graphical user interface associated with TCE 210 (e.g., GUI 120), the 3D spatial representation, associated with the first orientation. In this example, the 3D spatial representation may include a 3D spatial image associated with a particular viewing angle. The 3D spatial image may include one or more first spatial elements. The one or more first spatial elements may correspond to one or more first physical elements, of the dynamic system, that are visible, from the particular viewing angle. Additionally, or alternatively, computing device 105 may provide, for display (e.g., in free space, in a 3D display medium, etc.), the 3D spatial representation that includes a holographic representation of the dynamic system associated with the particular viewing angle.

As further shown in FIG. 5, process 500 may include obtaining a model to which the first information corresponds (act 525), identifying one or more first model elements, associated with the model, that correspond to the first information (act 530), and providing, via a user interface, the first model elements (act 535). For example, computing device 105 may identify a model associated with the 3D spatial representation. The model may, when executed, simulate behavior of the dynamic system. Additionally, or alternatively, the model may include one or more model elements (e.g., blocks 115, connectors 117, etc.) that are associated with the one or more spatial elements of the 3D spatial representation. Computing device 105 may identify one or more first model elements that correspond to the one or more first spatial elements. Computing device 105 may provide, for display via the graphical user interface (e.g., GUI 120), the one or more first model elements. In one example, computing device 105 may display the first model elements in a manner that are superimposed with the first spatial image (e.g., as shown in FIG. 1F). Additionally, or alternatively, computing device 105 may cause the first model elements to be displayed on the 3D physical structure within the spatial environment.

Additionally, or alternatively, identification of the model may be determined when the interactive session is established as described above in acts 505 and 510. In this example, the user may provide a request, to computing device 105 (e.g., using a keyboard, a pointing device, etc.), to obtain the model and computing device 105 may retrieve the model based on the request. Computing device 105 may provide, for display and via the graphical user interface, the model elements associated with the model. Computing device 105 may also, or alternatively, retrieve information, associated with the 3D spatial representation, with which the model is associated and may provide, for display and via the user interface, a 3D spatial image based on the information associated with the 3D spatial representation. In this example, the 3D spatial image may be based on a first viewing angle (e.g., a default viewing angle) that is predetermined by computing device 105 and/or programmed by the user.

As further shown in FIG. 5, process 500 may include receiving, from the interactive system, second spatial information associated with the physical structure (act 540) and identifying second information, associated with the 3D spatial representation, based on the second spatial information (act 545). For example, computing device 105 may receive, from interactive system 215, second spatial information, associated with the 3D physical structure, that corresponds to a second location and/or orientation. In this example, the user may interact with the spatial environment and may cause a location and/or an orientation, associated with the 3D physical structure, to change from a first location and/or orientation to a second location and/or orientation. The user may cause the location to change by moving the 3D physical structure from a first location, within the spatial environment, to a second location within the physical structure (e.g., based on second 3D coordinates x2, y2, and z2 or some other second coordinates). The user may also, or alternatively, cause the orientation to change by rotating the 3D physical structure in a manner that changes a first amount of roll, a first amount of pitch, and/or a first amount of yaw, of the 3D physical structure, to second amount of roll, a second amount of pitch, and/or a second amount of yaw. Interactive system 215 may provide, to computing device 105, second spatial information that identifies the second location and/or orientation of the 3D physical structure.

Additionally, or alternatively, the user may interact with the spatial environment to select a particular component of the 3D physical structure (e.g., a component that represents an aileron of the dynamic system, etc.). In this example, the user may select the component by moving in a particular manner, such as by pointing to the component, tracing the border of the component (e.g., using an index finger, etc.), obscuring the component (e.g., by holding up a hand, etc.), by looking at the component, etc.

Additionally, or alternatively, the user may select a particular component and may use a particular gesture (e.g., crossing fingers, tracing a shape of an "x," make a fist, cross arms, etc.) that may indicate that the user desires a model element, associated with the selected component, to be deleted. Interactive system 215 may obtain, from the spatial environment, information that identifies the particular gesture.

Interactive system 215 may obtain, from the spatial environment, information identifying the user's movement and/or particular gesture and may provide, to computing device 105, the second spatial information that includes the information that identifies the movement and/or particular gestures.

Computing device 105 may receive the second spatial information and may, in a manner similar to that described above with respect to act 520, use the second spatial information to identify second information, associated with the 3D spatial representation, that corresponds to a second viewing angle. The second viewing angle may be based on the second location and/or the second orientation. The second information, associated with the 3D spatial representation, may identify one or more second spatial elements. The one or more second spatial elements may include at least one spatial element that is different than the one or more first spatial elements. In one example, computing device 105 may provide, for display and via the graphical user interface (e.g., GUI 120), the 3D spatial image based on second information associated with the 3D spatial representation. The 3D spatial image may include the one or more second spatial elements that correspond to one or more second physical elements, of the dynamic system, that are visible from the second viewing angle. Additionally, or alternatively, computing device 105 may provide, for display (e.g., in free space, on a three dimensional display medium, etc.), the 3D spatial representation that corresponds to a holographic representation of the dynamic system associated with the second viewing angle.

Additionally, or alternatively, when the second spatial information indicates that a component of the 3D physical structure has been selected, computing device 105 may identify a second spatial element to which the selected component corresponds (e.g., based on dimensions, surface contours, etc.) and/or a location and/or orientation of the component in the spatial environment. Additionally, or alternatively, computing device 105 may cause the graphical user interface to navigate to a portion of the 3D spatial image, that corresponds to the identified second spatial element. When the second spatial information indicates that a model element, associated with the selected component, is to be deleted, computing device 105 may preclude the second spatial element from being displayed via the graphical user interface.

As still further shown in FIG. 5, process 500 may include identifying one or more second model elements, associated with the model, that correspond to the second information associated with the 3D spatial representation (act 550) and provide, via the user interface, the second model elements (act 555). For example, computing device 105 may identify one or more second model elements that correspond to the one or more second spatial elements identified by the second information associated with the 3D spatial representation. Computing device 105 may, based on identifying the second model elements, cause the graphical user interface to navigate to a portion of the model that includes the second model elements. In one example, computing device 105 may display the second model elements in a manner that are superimposed within the second spatial image (e.g., as shown in FIG. 1F).

Additionally, or alternatively, when the second spatial element is identified based on the user selecting a component of the 3D physical structure, computing device 105 may identify a second model element to which the identified second spatial element corresponds. Computing device 105 may, based on identifying the second model element, cause the user interface to navigate (e.g., by zooming in, by displaying the content of a hierarchical level, etc.) to a portion of the model that corresponds to the second model element. Additionally, or alternatively, the computing device 105 may preclude the second model element from being displayed, via the graphical user interface, when the second spatial information indicates that the second model element is to be deleted.

Figure 6:
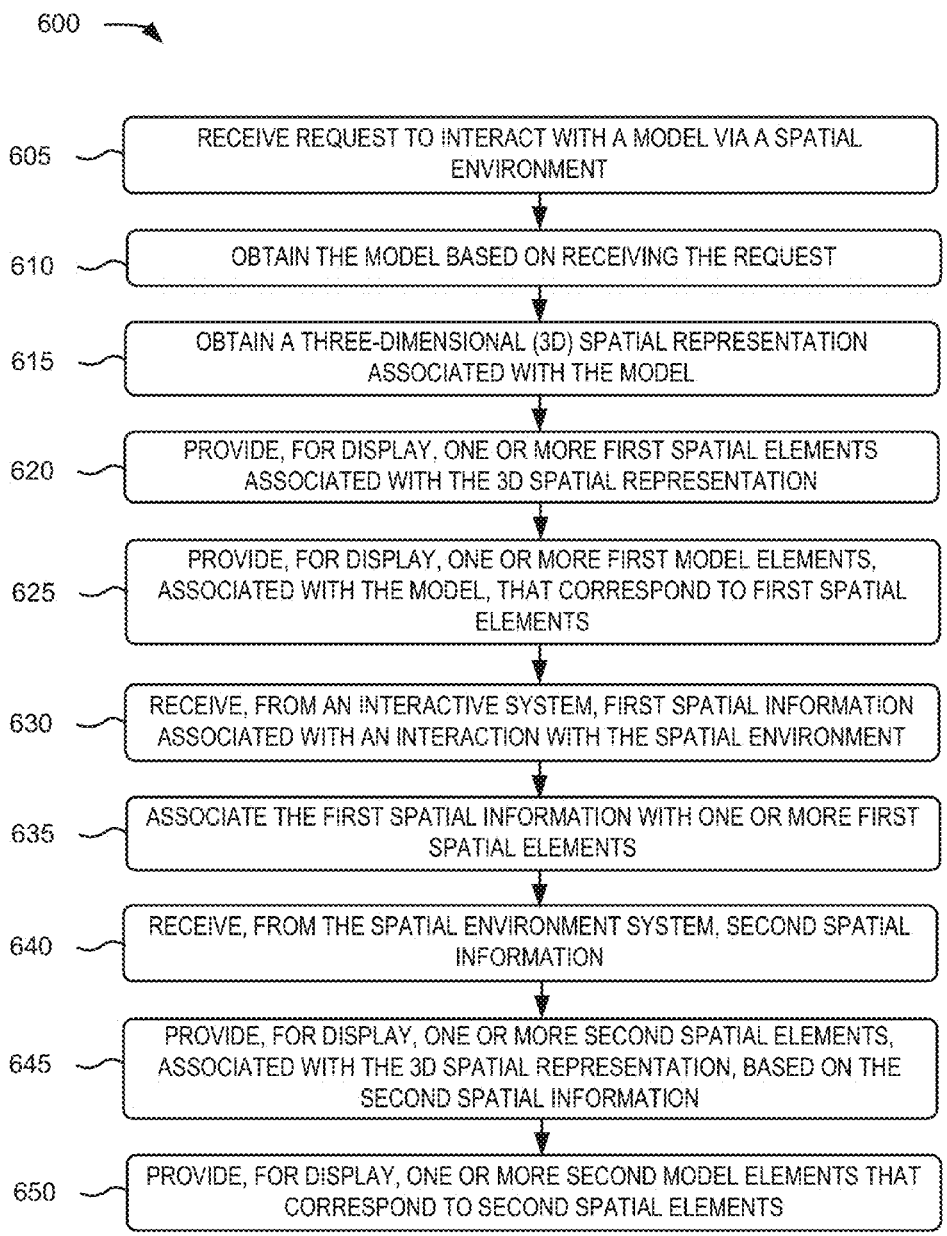
FIG. 6. is a flow chart of an example process for interacting with a spatial environment to access, modify, navigate, and/or execute a model.

FIG. 6. is a flow chart of an example process 600 for interacting with a 3D spatial environment to access, modify, navigate, or execute a model. In one implementation, process 600 may be performed by computing device 105. Additionally, or alternatively, process 600 may be performed by a device, or group of devices, separate from, or in combination with, computing device 105.

As shown in FIG. 6, process 600 may include receiving a request to interact with a model via a spatial environment (act 605) and obtaining a model based on receiving the request (act 610). For example, computing device 105 may receive a request, from a user associated with computing device 105, to interact with a model via a spatial environment. Computing device 105 may, based on receiving the request, cause TCE 210 to obtain the model that, when executed, simulates behavior of a dynamic system. Additionally, or alternatively, computing device 105 may, in a manner similar to that described above with respect to act 510 of FIG. 5, communicate with interactive system 215 to establish an interactive session associated with the model.

As also shown in FIG. 6, process 600 may include obtaining a 3D spatial representation associated with the model (act 615) and providing, for display, one or more first spatial elements associated with the 3D spatial representation (act 620). For example, computing device 105 may retrieve information associated with a 3D spatial representation of the dynamic system. The information, associated with the 3D spatial representation, may identify spatial elements that correspond to physical elements of the dynamic system. In one example, computing device 105 may provide, for display, the 3D spatial representation based on a first viewing angle. In this example, the spatial elements may be displayed in free space and/or in a 3D display medium as a holographic projection of the dynamic system from two or more viewing angles (e.g., 2, 4, 10, 50, etc. viewing angles) associated with the first viewing angle. The first viewing angle may be predetermined by computing device 105 and/or specified by the user.

Additionally, or alternatively, computing device 105 may cause TCE 210 to provide a graphical user interface (e.g., GUI 120) that includes a 3D spatial image associated with the first viewing angle. The 3D spatial image may include one or more first spatial elements of the 3D spatial representation. In this example, the one or more first spatial elements may correspond to stereoscopic representations of one or more first physical elements, of the dynamic system, based on the first viewing angle. Thus, the first spatial elements may correspond to the first physical elements, of the dynamic system, that are visible when viewed from the first viewing angle.

As further shown in FIG. 6, process 600 may include providing, for display, one or more first model elements, associated with the model, that correspond to the first spatial elements (act 625). For example, when computing device 105 displays the 3D spatial representation as a holographic projection of the dynamic system, computing device 105 may provide, for display via the graphical user interface, the model elements associated with the model.

Additionally, or alternatively, when computing device 105 displays, via the graphical user interface, the one or more first spatial elements as a 3D spatial image, computing device 105 may identify one or more first model elements that correspond to the one or more first spatial elements. Computing device 105 may provide, for display via the graphical user interface, the one or more first model elements.

As yet further shown in FIG. 6, process 600 may include receiving, from an interactive system, first spatial information associated with an interaction with the spatial environment (act 630). For example, computing device 105 may receive, from interactive system 215, first spatial information associated with a user that is interacting with a spatial environment. For example, the user may use all or a portion of the user's body (e.g., hands, arms, head, eyes, etc.), an inanimate object (e.g., a pen, pencil, book, 3D physical structure, etc.), user device 220 (e.g., smart phone, etc.), etc. to interact with the spatial environment.

In one example, a user may interact with the spatial environment by inserting a hand, and/or some other portion of the user, into the spatial environment. Interactive system 215 may detect the hand and may obtain information associated with all or a portion of the hand. Based on the information associated with the hand, computing device 105 may identify reference points associated with the hand that identify dimensions, surface contours, etc. (e.g., a palm, knuckles, thumb, one or more fingers, one or more finger tips, wrist, etc.) associated with the hand. Computing device 105 may also, or alternatively, determine a first location and/or orientation, of the hand, within the spatial environment. For example, computing device 105 may determine the first location and/or orientation based on a location, or a combination of locations, associated with one or more of the reference points (e.g., by determining an average location, a center of gravity, etc. based on the reference points) associated with the hand.

Additionally, or alternatively, the user may insert an inanimate object, such as a pen, into the spatial environment and interactive system 215 may detect the pen. Interactive system 215 may obtain information associated with all or a portion of the pen and may, based on the information associated with the pen, identify one or more reference points associated with the pen (e.g., a first end used for writing, a second end that is not used for writing, a cylindrical pen body, etc.). Computing device 105 may also, or alternatively, determine a first location and/or first orientation, of the pen, within the spatial environment. For example, computing device 105 may determine the first location and/or orientation based on a location or a combination of locations associated with the reference points associated with the pen.

Additionally, or alternatively, the user may insert user device 220 into the spatial environment. User device 220 may provide, to interactive system 215 and/or computing device 105 (e.g., via blue tooth, a network, etc.), a request to register user device 220. The request may include information, associated with user device 220, such as an identifier (e.g., a mobile directory number (MDN), etc.), an address (e.g., an Internet protocol (IP) address, a media access control (MAC) address, etc.), and/or information associated with a user of user device 220 (e.g., a username, password, etc.). Interactive system 215 and/or computing device 105 may receive the request and may store information associated with user device 220. In one example, interactive system 215 and/or computing device 105 may provide, to user device 220, an indication that user device 220 is registered. The indication may include access information to be used to communicate with interactive system 215 and/or computing device 105, such as an access code (e.g., a value, a string, etc.), etc.

User device 220 may receive the indication and may communicate with interactive system 215 and/or computing device 105 using, for example, the access information. In one example, user device 220 may provide information that identifies an element, in a model, to which user device 220 is to correspond. Additionally, or alternatively, user device 220 may provide information that identifies a first location and/or orientation, associated with user device 220. In some implementations, user device 220 may provide additional information relating to user device 220 and/or the element within the model, such as an initial input value for the element.

Interactive system 215 may receive the information associated with the object within the spatial environment (e.g., associated with the user, the inanimate object, user device 220, etc.). Interactive system 215 may provide, to computing device 105, first spatial information that includes the information associated with the user, inanimate object, user device 220, etc. (e.g., reference points, first location, first orientation, etc.) and computing device 105 may receive the first spatial information.

As still further shown in FIG. 6, process 600 may include associating the first spatial information with one or more first spatial elements (act 635). For example, computing device 105 may associate the first spatial information with the one or more first spatial elements. For example, when the user interacts with the spatial environment, computing device 105 may associate the first spatial information, that includes information associated with the user (e.g., reference points, first location, first orientation, etc. associated with the hand, etc.), with the one or more spatial elements associated with the 3D spatial representation that is based on the first viewing angle. Additionally, or alternatively, when the user interacts with the spatial environment using an inanimate object, computing device 105 may associate the first spatial information, that includes information associated with the inanimate object (e.g., reference points, first location, first orientation, etc. associated with the pen, etc.), with the one or more spatial elements. Additionally, or alternatively, when the user interacts with the spatial environment using user device 220, computing device 105 may associate the first spatial information, which includes information associated with the first location and/or orientation of user device 220, with the one or more spatial elements.

As also shown in FIG. 6, process 600 may include receiving, from the interactive system, second spatial information (act 640). For example, computing device 105 may receive, from interactive system 215, second spatial information associated with the user, the inanimate object, user device 220, etc. within the spatial environment. The second spatial information may indicate that a location and/or an orientation, associated with the object within the spatial environment, has changed from the first location and/or orientation to a second location and/or orientation within the spatial environment.

For example, the user may interact with the spatial environment by moving the hand (e.g., in any one or combination of spatial directions associated with the x-axis, y-axis, and/or z-axis) from the first location to a second location within the spatial environment. Additionally, or alternatively, the user may rotate the hand (e.g., based on an amount of roll, pitch, and/or yaw) from the first orientation to a second orientation. Interactive system 215 may track a change in location of the reference points, associated with the hand, and may determine that the hand has changed from the first location to the second location and/or has changed from the first orientation to the second orientation.

Additionally, or alternatively, the user may interact with the spatial environment by making gestures (e.g., using the hand, arms, wrist, head, etc.). For example, the user may make a first with the hand, which may be detected by interactive system 215 based on a pattern, associated with the reference points, when the user makes a fist. The user may make other gestures, which may be detected by interactive system 215, such as, for example, by crossing fingers, waving, pointing, making a thumbs up sign, tracing a pattern in space (e.g., an "x" pattern, a "✓" pattern, etc.), etc. The gestures may, in a manner to be described in greater detail below, enable the user to manipulate the 3D spatial representation being displayed as a 3D spatial image (e.g., via GUI 120) and/or as a 3D holographic image (e.g., in free space, via a 3D display medium, etc.).

Additionally, or alternatively, the user may interact with the spatial environment by causing the inanimate object, such as the pen, to move from the first location to a second location within the spatial environment. Additionally, or alternatively, the user may cause the pen to rotate (e.g., based on an amount of roll, pitch, and/or yaw) from the first orientation to a second orientation. Interactive system 215 may track a change in location of the reference points, associated with the pen, and may determine that the hand has changed from the first location to the second location and/or has changed from the first orientation to the second orientation.

Additionally, or alternatively, the user may cause user device 220 to move from the first location to a second location within the spatial environment and/or to rotate from the first orientation to a second orientation. User device 220 may provide, to interactive system 215 and/or computing device 105 a signal that indicates that user device 220 has changed from the first location to the second location, and/or from the first orientation to the second orientation.

Interactive system 215 may provide, to computing device 105, second spatial information that includes the information obtained from the spatial environment and computing device 105 may receive the second spatial information.

As further shown in FIG. 6, process 600 may include providing, for display, one or more second spatial elements, associated with the 3D spatial representation, based on the second spatial information (act 645). For example, computing device 105 may determine, from the second spatial information, a second location and/or orientation, associated with the user, the inanimate object, user device 220, etc., within the spatial environment. Based on the determination of the second location and/or orientation, computing device 105 may cause a viewing angle, associated with the 3D spatial representation, to change from the first viewing angle to a second viewing angle. For example, computing device 105 may cause the spatial elements, associated with the 3D spatial representation that is being displayed as a holographic image, to be displayed in a manner that corresponds to the viewing angle.

Additionally, or alternatively, computing device 105 may cause one or more second spatial elements, associated with the 3D spatial representation that is being displayed as a 3D spatial image, to be displayed in a manner that corresponds to the second viewing angle. In this example, the second spatial elements may correspond to second physical elements, associated with the dynamic system, that are visible from the second viewing angle.

Additionally, or alternatively, computing device 105 may determine, from the second spatial information, that the user has made a particular gesture (e.g., with a hand, arm, etc.) and/or movement with the hand and/or object (e.g., a pen, user device 220, etc.) when interacting with the spatial environment. For example, when the second spatial information indicates that the user made a first gesture (e.g., a first or some other first gesture) and/or first movement (e.g., tracing a circular pattern with the object, or some other first movement, etc.), computing device 105 may cause the 3D spatial representation to start changing orientation (e.g., rotating) about a particular axis (e.g., a yaw axis). The user may make another first gesture (e.g., opening the first or some other second gesture) and/or another first movement (e.g., stop tracing the circular pattern or some other second movement), which may cause the 3D spatial representation to stop rotating. The user may make other first gestures that cause the 3D spatial representation to start and/or stop rotating about a different axis (e.g., a pitch axis, a roll axis, etc.).

Additionally, or alternatively, when the second spatial information indicates that the user has made a second gesture and/or movement, computing device 105 may cause the 3D spatial representation to move from a first location to a second location. The user may make other gestures and/or movements (e.g., with or without using an object or user device 220) that cause computing device 105 to manipulate the 3D spatial representation in other ways, such as, for example zooming in or out of the 3D spatial representation; changing colors and/or patterns associated with the 3D spatial representation; selecting spatial elements associated with the 3D spatial representation; etc.

Additionally, or alternatively, computing device 105 may interpret a particular gesture as an indication that a model element attribute, such as, for example, a parameter relating to sample time, a dimension, a gain factor, etc., is to be added, removed, or changed. As one example, assume that interactive system 215 displays a particular model element attribute, such as a force parameter, in connection with the 3D spatial representation. Assume further that interactive system 215 detects that the user made a particular gesture, such as a pinching motion, in connection with the force parameter. Computing device 105 may interpret the pinching motion as an indication that the value of the force parameter is to be decreased in the model. Thus, computing device 105 may associate particular gestures with particular actions in relation to the model elements and/or attributes of the model elements.

As yet further shown in FIG. 6, process 600 may include providing, for display, one or more second model elements that correspond to the second spatial elements (act 650). For example, computing device 105 may identify one or more second model elements that correspond to the one or more second spatial elements, of the 3D spatial representation, being displayed as a 3D spatial image via a graphical user interface (e.g., GUI 120). The one or more second model elements may include one or more model elements that are not included among the one or more first model elements. Additionally, or alternatively, the one or more second model elements may not include one, some, or any of the first model elements. Computing device 105 may also, or alternatively, cause the graphical user interface to navigate to a portion of the model that includes the one or more second model elements (e.g., blocks 115, connectors 117, etc.).

Additionally, or alternatively, computing device 105 may modify the one or more second model elements, or one or more model elements relating to the one or more second model elements, based on receiving the second spatial information. For example, if the second spatial information includes information indicating a change to the geometry of a second spatial element, of the one or more second spatial elements, computing device 105 may modify characteristics of a second model element, of the one or more second model elements, corresponding to the second spatial element (e.g., by modifying an equation with which the second model element is associated). Additionally, computing device 105 may modify characteristics of another model element (not included in the one or more second model elements, such as a model element at a different hierarchical level of the model than the one or more second model elements) based on the modification to the second model element.

Figure 7:
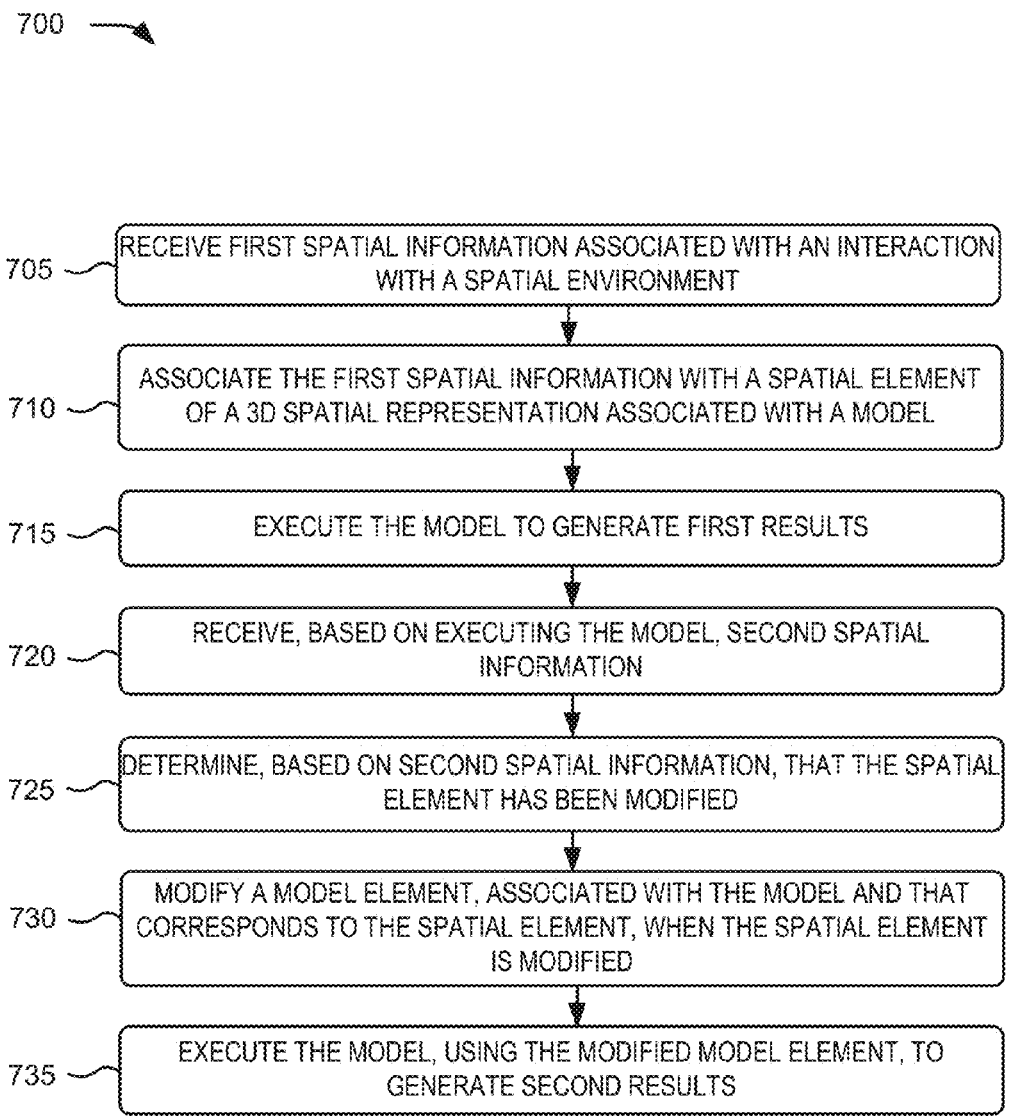
FIG. 7 is a flow chart of an example process for interacting with a 3D spatial environment to dynamically modify a model.

FIG. 7 is a flow chart of an example process 700 for interacting with a 3D spatial environment to dynamically modify a model. In one implementation, process 700 may be performed by computing device 105. Additionally, or alternatively, process 700 may be performed by a device, or group of devices, separate from, or in combination with, computing device 105. FIGS. 8A and 8B are diagrams of examples 800 of a user interacting with a 3D spatial representation being displayed within a spatial environment. In the description below, all or a portion of process 700 will be described with references to example user interactions 800 of FIGS. 8A and 8B.

Assume that, in the description below and in a manner similar to that described above with respect to acts 605 and 610 of FIG. 6, an interactive session, with interactive system 215, has been established and a model has been obtained. Assume further that computing device 105 has provided, for display, a 3D spatial representation associated with the model in a manner similar to that described above with respect to acts 615 and 620 of FIG. 6. Assume still further, that computing device 105 has provided, in a manner similar to that described above with respect to act 625 of FIG. 6, a graphical user interface (GUI 120) that includes model elements, associated with the model, that correspond to spatial elements associated with the 3D spatial representation.

As shown in FIG. 7, process 700 may include receiving first spatial information associated with an object that is interacting with a spatial environment (act 705). For example, computing device 105 may receive, from interactive system 215, first spatial information. In this example, a user, of computing device 105, may interact with a spatial environment in a manner similar to that described above with respect to FIGS. 5 and/or 6 (e.g., using a finger, a hand, a head, eyes, an inanimate object, user device 220, etc.).

Additionally, or alternatively, the user may interact with the 3D spatial representation that is being displayed within the spatial environment. For example, the 3D spatial representation may be displayed as a holographic image within the spatial environment (e.g., within free space, a 3D display medium, etc.), which may enable the user to interact with the holographic image. Additionally, or alternatively, the user may interact with the 3D spatial representation that is being displayed, as a 3D spatial image, within the spatial environment (e.g., via a user interface on a display device), which may enable the user to interact with the 3D spatial image.

For example, as shown in example 800 of FIG. 8A, interactive system 215 may provide a spatial environment in which GUI 120 is being displayed by computing device 105. GUI 120 may include a 3D spatial image, of a dynamic system (e.g., an airplane wing/aileron system). The 3D spatial image may include a pair of spatial elements 805-1 and 805-2 (hereinafter referred to collectively as "spatial elements 805" and individually as "spatial element 805"). Spatial element 805 may correspond to a physical element of the dynamic system. For example, spatial element 805-1 may represent a first physical element (e.g., a wing) and spatial element 805-2 may represent a second physical element (e.g., an aileron) that is attached to physical element 805-1 by one or more other physical elements 805 (e.g., one or more control levers, hinges, etc.). Spatial element 805-2 may be associated with a first orientation (e.g., represented by $\theta_1$ in FIG. 8A) relative to spatial element 805-1.

A user, of computing device 105, may interact (e.g., using a finger, hand, arm, body, head, pair of eyes, etc.) and/or use an object (e.g., a pen, pencil, book, user device 220, etc.) to interact with one or more of spatial elements 805 included within GUI 120. For example, the user may desire to interact with a particular spatial element 805 associated with the 3D spatial image and may select the particular spatial element 805. In one example, the user may select spatial element 805-2 by pointing to spatial element 805-2, by tracing (e.g., with a finger, a pen, user device 220, etc.) a border associated with spatial element 805-2, by tracing an area of 3D spatial image associated with spatial element 805-2, by causing user device 220 to send a command that indicates selection of spatial element 805-2, etc. The user may perform the pointing, tracing, etc. in a manner that identifies an area, of GUI 120, that corresponds to spatial element 805-2 and/or by touching the display that identifies the area, of GUI 120, that corresponds to spatial element 805-2.

Additionally, or alternatively, the user may interact with the 3D spatial image in another way, such as by enabling an attribute, associated with a spatial element, to be represented and/or modified (e.g., a simulated force, stress, strain, torque, airflow, etc.). In one example, the user may make a particular gesture and/or movement to request that a force attribute (e.g., that identifies a simulated force acting on a spatial element 805) to be displayed within GUI 120 (e.g., shown as a dashed arrow labeled as "FORCE"). The user may, for example, interact with the force arrow to change a location, direction, and/or amount of simulated force being applied to spatial element 805-2. In one example, the user may make a small vertical movement of the hand to correspond to a smaller force (e.g., that corresponds to a shorter arrow) and a large vertical movement of the hand to correspond to a larger force (e.g., that corresponds to a longer arrow). Additionally, or alternatively, the user may make a sound (e.g., by speaking a value, etc.) that corresponds to an amount of force to be associated with the force attribute, which may be provided for display via GUI 120. Thus, in one example, the user may make a gesture that corresponds to a force attribute, may say a value that corresponds to an amount of the force. The user may make other gestures, movements, sounds, etc. to cause other symbols, that represent other attributes, to be included in GUI 120, with which the user may interact.

Interactive system 215 (e.g., using emitter-detectors 410) may, in a manner similar to that described above with respect to act 515 of FIG. 5, obtain information that identifies the user and/or object (e.g., based on reference points, etc.) that is interacting with the spatial environment and/or 3D spatial image. The information may identify reference points associated with the user and/or object; a first location and/or orientation associated with the user and/or object; gestures, movements, and/or sounds made by the user and/or object, respectively; etc. Interactive system 215 may provide the information, as first spatial information, to computing device 105 and computing device 105 may receive the first spatial information.

As also shown in FIG. 7, process 700 may include associating the first spatial information with a spatial element of a 3D spatial representation associated with a model (act 710). For example, computing device 105 may determine, based on the first spatial information (e.g., the reference points, location, orientation, etc.) that the user desires to select a spatial element of the 3D spatial image. Computing device 105 may, based on selecting the spatial element, associate the first spatial information to information associated with the spatial element. The information, associated with the spatial element, may identify dimensions, surface contours, edges, a location within GUI 120, an orientation, etc. associated with the spatial element. Additionally, or alternatively, computing device 105 may cause an appearance, associated with the spatial element within the 3D spatial image, to change (e.g., a change in color and/or pattern; a change in border color, thickness, and/or pattern; etc.) based on selection of the spatial element.

Additionally, or alternatively, computing device 105 may, based on the first spatial information, cause a symbol (e.g., an arrow, etc.) to be displayed, via GUI 120, that represents a simulated force, torque, stress, strain, airflow, etc. that is acting on a particular spatial element. Additionally, or alternatively, computing device 105 may cause a virtual user (e.g., a virtual hand, arm, etc.) and/or object (e.g., pen, user device 220), etc. to be displayed, via GUI 120, in a manner that simulates the user and/or object interacting with the spatial environment and/or the 3D spatial image.

As further shown in FIG. 7, process 700 may include executing the model to generate first results (act 715). For example, computing device 105 may, based on the first spatial information, execute the model to generate a first result. In one example, computing device 105 may automatically execute the model based on receiving the first spatial information, determining selection of the spatial element, associating the user and/or object with the spatial element, etc. Additionally, or alternatively, computing device 105 may, based on the first spatial information, determine that the user made a particular gesture (e.g., thumbs up, etc.) and/or movement (e.g., tracing a symbol "✓" using the object) that indicates that the user desires the model to be executed. When the user makes the particular gesture and/or movement, computing device 105 may cause the model to execute. The user may make other gestures that cause the model to temporarily pause execution, restart execution, make an execution step forward, make an execution step backwards, terminate execution, etc.

As still further shown in FIG. 7, process 700 may include receiving, based on executing the model, second spatial information (act 720). For example, computing device 105 may receive, from interactive system 215, second spatial information. In this example, the user may interact with the spatial environment and/or the 3D spatial image to cause a first orientation (e.g., shown as $\theta_1$ in FIG. 8A), associated with the selected spatial element (e.g., spatial element 805-2), to change to a second orientation. The user may, for example, change a location orientation, associated with the portion of the user (e.g., the hand) and/or object (e.g., pen, user device 220), in a manner that corresponds to the desired change in orientation of the select spatial element. In one example, the user may move and/or rotate the hand or object to reduce the difference in orientation (e.g., causing $\theta$ to decrease) between spatial element 805-2 and 805-1 (e.g., as shown in FIG. 8A).

For example, as shown in FIG. 8B, the user may interact with the spatial environment and/or 3D spatial image in a manner that causes the first orientation to change to a second orientation (e.g., shown as $\theta_2$, where $\theta_2$ is less than $\theta_1$). Additionally, or alternatively, the user may interact with the 3D spatial image (e.g., using hand gestures, etc.) in a manner that causes a location, direction, and/or amount of force to change relative to the force identified in the first spatial information. In this example, the user may interact with the arrow (e.g., labeled as "FORCE") within the 3D spatial image by causing the location of the arrow to change (e.g., that causes a location at which the simulated force is applied to change); shortening the length of the arrow (e.g., that causes an amount of simulated force to decrease); changing a direction associated with the arrow (e.g., that cause a direction at which the simulated force is applied to change); etc. Additionally, or alternatively, the user may make a particular gesture and/or movement (e.g., using a pen, user device 220), that causes the selected spatial element to be deleted (e.g., by crossing fingers, making a "x" symbol with index fingers, tracing a "x" symbol with a finger or object, etc.).

Interactive system 215 (e.g., using emitter-detectors 410) may, in a manner similar to that described above with respect to block 515 of FIG. 5, obtain information that identifies the user and/or object (e.g., based on reference points, etc.) that is interacting with the spatial environment and/or 3D spatial image. The information may identify reference points associated with the user and/or object; a second location and/or orientation associated with the user and/or object; gestures and/or movements made by the user and/or object, respectively; etc. Interactive system 215 may provide the information, as second spatial information, to computing device 105 and computing device 105 may receive the second spatial information.

As further shown in FIG. 7, process 700 may include determining, based on the second spatial information, that the spatial element has been modified (act 725) and modifying a model element, associated with the model and that corresponds to the spatial element, when the spatial element has been modified (act 730). For example, computing device 105 may determine, based on the second spatial information, that a location and/or an orientation of the selected spatial element has changed from the first location and/or orientation to the second location and/or orientation. Computing device 105 may also, or alternatively, cause the graphical user interface (e.g., GUI 120) to change the selected spatial element from the first location and/or orientation to the second location and/or orientation.

Additionally, or alternatively, computing device 105 may identify a model element, associated with the model, which corresponds to the selected spatial element. Computing device 105 may modify one or more parameters, associated with the model element, based on differences between the first spatial information and the second spatial information. For example, computing device 105 may identify a parameter, associated with the model element, that corresponds to location and/or orientation. Computing device 105 may change the parameter, from a first value (e.g., that corresponds to the first location and/or orientation) to a second value (e.g., that corresponds to the second location and/or orientation).

Additionally, or alternatively, computing device 105 may, as described above, modify a parameter, associated with the model element, to reflect the change in location, amount, and/or direction of the simulated force, being applied to the selected spatial element, has changed. Additionally, or alternatively, computing device 105 may delete a model element, or render the model element unavailable to execute, when the second spatial information indicates that the user made a particular gesture and/or movement that indicates that the user desire the selected spatial element to be deleted.

As still further shown in FIG. 7, process 700 may include executing the model, using the modified model element, to generate second results (act 735). For example, computing device 105 may execute the model that includes the modified model element. Computing device 105 may, based on executing the model using the modified model element, generate second results. In one example, the second results may not match the first results that were previously generated by executing the model based on the model element prior to being modified.

Systems and/or methods, described herein, may enable a computing device, that uses a model to simulate behavior of a dynamic system, to communicate with an interactive system that provides a spatial environment with which a user, of the computing device, can interact. The user may access, modify, navigate, and/or execute the model by interacting with a 3D spatial representation, of the dynamic system, via the spatial environment. Interacting with the model, via the spatial environment and instead of using conventional techniques may improve a user experience when using the model to run a simulation and/or improve a manner in which the model simulates behavior of the dynamic system.

The foregoing description provides illustration and description, but is not intended to be exhaustive or to limit the description to the precise form disclosed. Modifications and variations are possible in light of the above embodiments or may be acquired from practice of the implementations.

The acts provided in FIGS. 5-7 are provided for explanatory purposes only. In other implementations, the processes, described in FIGS. 5-7, may include fewer acts, additional acts, different acts, or differently arranged acts than shown in FIGS. 5-7. Further, non-dependent acts may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain implementations may involve a component that performs one or more functions. These components may include hardware, such as an ASIC or a FPGA, or a combination of hardware and software.

Even though particular combinations of features are recited in the claims and/or disclosed in the specification, these combinations are not intended to limit disclosure of the possible implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the implementations unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise.

What is claimed is:

1. A method comprising:
 receiving spatial information associated with a three-dimensional (3D) structure that is located within a spatial environment,
  the spatial information identifying characteristics of the 3D structure,
   the characteristics including information identifying at least one of:
    dimensions of the 3D structure,
    surface contours of the 3D structure,
    a location of the 3D structure within the spatial environment, or
    an orientation of the 3D structure within the spatial environment,
  the receiving the spatial information being performed by a computing device, and
  the computing device being associated with a technical computing environment (TCE);
 determining at least one of a movement, a gesture, or a signal within the spatial environment,
  the at least one of the movement, the gesture, or the signal being associated with at least one of:
   all or a portion of a body of a user that is within the spatial environment,
   an inanimate physical object within the spatial environment, or
   the 3D structure,
  the determining the at least one of the movement, the gesture, or the signal being performed by the computing device;
 performing an operation on a model based on the at least one of the movement, the gesture, or the signal,
  the model being a topological model that, when executed, simulates behavior of a dynamic system,
  the 3D structure being associated with one or more model elements of the model,
  the performing the operation comprising:
   navigating the one or more model elements, associated with the 3D structure, based on at least one of the characteristics of the 3D structure identified by the spatial information, the movement, the gesture, or the signal,
    the one or more model elements, when executed, simulating behavior of a part of the dynamic system,
    the navigating the one or more model elements being performed by the computing device; and
 causing, based on navigating the one or more model elements and based on the spatial information, at least one model element of the model to be displayed in the TCE,
  the causing the at least one model element of the model to be displayed being performed by the computing device.

2. The method of claim 1, where the 3D structure includes a 3D physical structure.

3. The method of claim 1, where the 3D structure includes a 3D virtual representation of at least a portion of the dynamic system.

4. The method of claim 1, further comprising:
 identifying, based on the spatial information, the part of the dynamic system,
  the part of the dynamic system being linked to the one or more model elements of the model, and
 where causing the at least one of the model elements to be displayed is based on identifying the part of the dynamic system.

5. The method of claim 1, where the characteristics include the location and the orientation of the 3D structure within the spatial environment,
 where the 3D structure corresponds to a portion of the dynamic system, and
 where the method further comprises:
  obtaining information associated with a 3D spatial representation of the dynamic system,
   the 3D spatial representation being based on a viewing angle, the location, and the orientation, and
   the information, associated with the 3D spatial representation, representing a stereoscopic projection of the dynamic system; and
  providing, for display, the 3D spatial representation based on the information associated with the 3D spatial representation,
   the 3D spatial representation being different than the one or more model elements and the 3D spatial representation being provided for display simultaneously with the one or more model elements.

6. The method of claim 5, further comprising:
 identifying a spatial element, associated with the 3D spatial representation, based on the viewing angle, the location, and the orientation,
  the spatial element corresponding to the part of the dynamic system,
  the part of the dynamic system being visible when the dynamic system is viewed from the viewing angle, while being positioned at the location and orientation; and causing the spatial element to be displayed in a 3D display medium or in a 3D volume of space.

7. The method of claim 1, further comprising:
receiving other spatial information associated with the 3D structure;
determining, based on the other spatial information, that the 3D structure has changed from a first location or orientation, within the spatial environment, to a second location or orientation within the spatial environment,
the first location or orientation being identified by the spatial information, and
the second location or orientation being identified by the other spatial information; and
causing one or more different model elements to be displayed in the TCE based on the other spatial information.

8. The method of claim 1, further comprising:
obtaining a 3D spatial representation of the dynamic system,
the 3D spatial representation including a plurality of spatial elements;
identifying, based on determining the movement, the gesture, or the signal, an instruction to perform an operation on the 3D spatial representation; and
performing the operation on the 3D spatial representation based on identifying the instruction.

9. The method of claim 8, where the instruction corresponds to at least one of:
a first instruction to delete a spatial element of the plurality of spatial elements,
a second instruction to zoom in to the spatial element when the 3D spatial representation is being displayed,
a third instruction to zoom out from a first portion of the 3D spatial representation, that includes the spatial element, to a second portion of the 3D spatial representation when the 3D spatial representation is being displayed,
a fourth instruction to change a viewing angle associated with the spatial element,
a fifth instruction to change a viewing angle associated with the 3D spatial representation, or
a sixth instruction to change a location associated with the 3D spatial representation.

10. The method of claim 1, where performing the operation includes at least one of:
deleting a particular model element of the model;
causing a user interface, associated with the TCE, to navigate to a particular model element of the model;
causing the user interface to navigate from a first portion of the model to a second portion of the model;
causing the user interface to zoom into or out of a particular model element of the model;
causing a parameter, associated with a particular model element of the model to change;
causing one or more equations to be added to or removed from a particular model element of the model; or
causing one or more equations, associated with a particular model element of the model, to be changed.

11. The method of claim 1, further comprising:
receiving the signal from the inanimate physical object; and
identifying, based on receiving the signal, the operation to be performed.

12. The method of claim 1,
where causing the at least one model element of the model to be displayed includes at least one of:
causing the at least one model element to be superimposed on a 3D representation of a portion of the dynamic system, or
causing the at least one model element to be displayed on the 3D structure.

13. The method of claim 1, where the model is at least one of a time-based block diagram, a discrete-event based diagram, a dataflow diagram, a state transition diagram, a software diagram, or a noncausal block diagram.

14. The method of claim 1, where the model is a block diagram and the one or more model elements include blocks logically connected by connectors.

15. The method of claim 1, where the 3D structure includes at least one of:
a 3D physical structure,
a user device,
the all or the portion of the body of the user that is within the spatial environment, or
the inanimate physical object within the spatial environment.

16. A computing device comprising:
one or more processors to:
provide, for display by a technical computing environment (TCE), a first portion of a model,
the model being a topological model that, when executed, simulates behavior of a dynamic system, and
the model including a plurality of model elements that, when executed, simulate behavior of parts of the dynamic system,
receive first spatial information associated with a three-dimensional (3D) structure that is located within a spatial environment,
the first spatial information including information identifying a first location and a first orientation of the 3D structure within the spatial environment,
determine at least one of a movement, a gesture, or a signal within the spatial environment,
the at least one of the movement, the gesture, or the signal being associated with at least one of:
all or a portion of a body of a user that is within the spatial environment,
an inanimate physical object within the spatial environment, or
the 3D structure;
perform an operation on the first portion of the model based on the at least one of the movement, the gesture, or the signal,
the 3D structure being associated with one or more model elements of the first portion of the model,
where the one or more processors, when performing the operation, are to:
navigate the one or more model elements associated with the 3D structure, based on at least one of the spatial information, the movement, the gesture, or the signal,
and
cause, based on navigating the one or more model elements associated with the 3D structure, a second, different portion of the model to be displayed in the TCE.

17. The computing device of claim 16, where the 3D structure includes at least one of:
an inanimate physical object,
a 3D virtual representation of the system, or
the all or the portion of the body of the user that is within the spatial environment.

18. The computing device of claim 16, where the 3D structure includes a user device, and
where, when receiving the first spatial information, the one or more processors are to:
receive a signal from the user device, and
obtain, from the received signal, the first location and the first orientation.

19. The computing device of claim 16, where the one or more processors are further to:
receive other spatial information associated with the 3D structure,
determine, based on the other spatial information, that the 3D structure has changed from the first location or the first orientation, within the spatial environment, to a second location or a second orientation within the spatial environment,
identify a different part of the system based on the second location or the second orientation, and
cause the TCE to navigate to one or more different model elements based on identifying the different part of the system.

20. The computing device of claim 16, where the one or more processors, when determining at least one of the movement, the gesture, or the signal, are to:
detect a particular gesture within the spatial environment.

21. The computing device of claim 16, where the one or more processors, when determining at least one of the movement, the gesture, or the signal, are to:
detect a particular gesture or movement within the spatial environment.

22. A non-transitory computer-readable medium for storing instructions, the instructions comprising:
a plurality of instructions that, when executed by a processor of a computing device, cause the processor to:
provide, for display by a technical computing environment (TCE), a plurality of model elements of a model,
the model being a topological model that, when executed, simulates behavior of a dynamic system,
the model including a plurality of model elements that, when executed, simulate behavior of parts of the dynamic system,
receive spatial information associated with a three-dimensional (3D) structure located within a spatial environment,
the 3D structure being associated with one or more model elements of the plurality of model elements of the model,
determine at least one of a movement, a gesture, or a signal within the spatial environment,
the at least one of the movement, the gesture, or the signal being associated with at least one of:
all or a portion of a body of a user that is within the spatial environment,
an inanimate physical object within the spatial environment, or
the 3D structure;
perform an operation on the model based on the at least one of the movement, the gesture, or the signal,
where the plurality of instructions to perform the operation include:
a plurality of instructions to navigate the one or more model elements associated with the 3D structure, based on at least one of the spatial information, the movement, the gesture, or the signal; and
cause, based on navigating the one or more model elements and based on the spatial information, at least one model element of the plurality of model elements of the model to be displayed in the TCE.

23. The non-transitory computer-readable medium of claim 22, where the instructions further include:
a plurality of instructions that, when executed by the processor, cause the processor to:
execute the model,
obtain first results based on executing the model,
modify the model to generate a modified model,
execute the modified model, and
obtain second results based on executing the modified model,
the second results being different than the first results.

24. The non-transitory computer-readable medium of claim 23,
where the plurality of instructions to cause the processor to modify the model include:
a plurality of instructions that, when executed by the processor, cause the processor to:
change a parameter associated with at least one model element, of the plurality of model elements, based on the movement, the gesture, or the signal.

25. The non-transitory computer-readable medium of claim 23,
where the plurality of instructions to cause the processor to modify the model include:
a plurality of instructions that, when executed by the processor, cause the processor to:
delete at least one model element, of the plurality of model elements, based on the movement, the gesture, or the signal.

* * * * *